(12) United States Patent
Kim et al.

(10) Patent No.: US 8,058,649 B2
(45) Date of Patent: Nov. 15, 2011

(54) THIN-FILM TRANSISTOR AND METHOD OF MANUFACTURING THE SAME

(75) Inventors: Sung-Hoon Kim, Seoul (KR); Kwan Hee Lee, Kingsgrove (AU); Sung-Hoon Yang, Seoul (KR); Young-Hoon Yoo, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 215 days.

(21) Appl. No.: 12/399,774

(22) Filed: Mar. 6, 2009

(65) Prior Publication Data

US 2009/0278127 A1   Nov. 12, 2009

(30) Foreign Application Priority Data

May 8, 2008   (KR) ................. 10-2008-0042686

(51) Int. Cl.
*H01L 29/00* (2006.01)
*H01L 21/00* (2006.01)
(52) U.S. Cl. ........... 257/49; 257/E33.053; 257/E21.414; 257/E29.288; 438/149

(58) Field of Classification Search ............ 257/59, 257/66, E33.053, E21.414, E29.288, 49, 257/52, 57, 27, 192; 438/158, 151, 648, 438/142, 149
See application file for complete search history.

(56) References Cited

U.S. PATENT DOCUMENTS

| | | | | |
|---|---|---|---|---|
| 5,136,358 | A * | 8/1992 | Sakai et al. | 257/659 |
| 5,441,768 | A * | 8/1995 | Law et al. | 438/482 |
| 5,834,345 | A * | 11/1998 | Shimizu | 438/158 |
| 6,545,293 | B2 * | 4/2003 | Wong | 257/59 |

* cited by examiner

*Primary Examiner* — Thomas L Dickey
*Assistant Examiner* — Nikolay Yushin
(74) *Attorney, Agent, or Firm* — Innovation Counsel LLP

(57) ABSTRACT

In one embodiment, a thin-film transistor (TFT) includes a gate electrode, a semiconductor pattern, first and second electrodes and a protective layer. The semiconductor pattern is formed on the gate electrode, and includes a first semiconductor layer deposited at a first deposition speed and a second semiconductor layer deposited at a second deposition speed faster than the first deposition speed. The first and second electrodes are spaced apart from each other on the semiconductor pattern. The protective layer is formed on the semiconductor pattern to cover the first and second electrodes, and makes contact with a channel region of the first semiconductor layer to form an interface with the first semiconductor layer. Thus, electrical characteristics of the TFT may be improved.

24 Claims, 17 Drawing Sheets

THIN-FILM TRANSISTOR AND METHOD OF MANUFACTURING THE SAME

PRIORITY STATEMENT

This application claims priority under 35 U.S.C. §119 to Korean Patent Application No. 2008-42686, filed on May 8, 2008 in the Korean Intellectual Property Office (KIPO), the contents of which are herein incorporated by reference in their entirety.

BACKGROUND OF THE INVENTION

1. Field of the Invention

Example embodiments of the present invention relate to a thin-film transistor (TFT) and a method of manufacturing the TFT. More particularly, example embodiments of the present invention relate to a TFT capable of improving electrical characteristics between a channel region and a protective layer to decrease an off current, and a method of manufacturing the TFT.

2. Description of the Related Art

Liquid crystal display (LCD) devices are one of the most widely used types of flat panel display (FPD) devices. An LCD device includes two substrates including electrodes and a liquid crystal layer interposed between the substrates. Liquid crystals of the liquid crystal layer vary arrangement in response to an electric field applied thereto, and thus light transmittance of the liquid crystal layer is changed, thereby displaying an image. Recently, the screen size and the resolution of LCD devices have been increased.

One of the substrates of the LCD device includes a plurality of pixel electrodes arranged in a matrix shape, and another of the substrates of the LCD device includes a common electrode. When a voltage is applied to each of the pixel electrodes, the image is displayed. A thin-film transistor (TFT) that is a switching element having three terminals is electrically connected to each of the pixel electrodes. The TFT including a gate electrode, a source electrode and a drain electrode, a gate line and a data line are formed on the substrate. The gate line transmits a gate signal to control the TFT. The data line transmits a voltage to the pixel electrode. The source electrode is electrically connected to the data line. The drain electrode is spaced apart from the source electrode, and faces the source electrode. The source electrode and the drain electrode are electrically connected to a semiconductor pattern that is under the source and drain electrodes through an ohmic contact layer.

When a gate on voltage Von is applied to the gate electrode, the voltage is applied to the drain electrode through the source electrode and a channel region of the semiconductor pattern. The channel region is exposed between the source and drain electrodes.

However, electrical characteristics of the semiconductor pattern may be poor. Thus, leakage current flows from the channel region when the TFT is turned off. When the off current is increased, contrast ratio is decreased and afterimages are increased. In addition, manufacturing time is increased thereby increasing manufacturing costs for compensating the electrical characteristics of the semiconductor pattern.

SUMMARY OF THE INVENTION

Example embodiments of the present invention provide a thin-film transistor (TFT) capable of improving electrical characteristics between a channel region and a protective layer to decrease an off current.

Example embodiments of the present invention also provide a method of manufacturing the TFT.

According to one aspect of the present invention, a TFT includes a gate electrode, a semiconductor pattern, first and second electrodes and a protective layer. The semiconductor pattern is formed on the gate electrode, and includes a first semiconductor layer deposited at a first deposition speed and a second semiconductor layer deposited at a second deposition speed faster than the first deposition speed. The first and second electrodes are spaced apart from each other on the semiconductor pattern. The protective layer is formed on the semiconductor pattern to cover the first and second electrodes, and makes contact with a channel region of the first semiconductor layer to form an interface with the first semiconductor layer.

The protective layer may include two layers deposited at different deposition speeds, and one of the two layers, which is deposited at a slower deposition speed, may make contact with the channel region of the first semiconductor layer to form the interface with the first semiconductor layer.

The TFT may further include a gate insulation layer interposed between the gate electrode and the semiconductor pattern, and a portion of the gate insulation layer may make contact with the first semiconductor layer to form an interface with the gate insulation layer.

According to another aspect of the present invention, a TFT includes a gate electrode, a gate insulation layer, a semiconductor pattern, a first electrode, a second electrode and a protective layer. The gate insulation layer is formed on the gate electrode, and makes contact with the gate electrode to form an interface with the gate electrode. The semiconductor pattern is formed on the gate insulation layer to form an interface with the gate insulation layer, and includes a first semiconductor layer deposited at a first deposition speed and a second semiconductor layer deposited at a second deposition speed faster than the first deposition speed. The first electrode is formed on the semiconductor pattern. The second electrode is spaced apart from each other on the semiconductor pattern. The protective layer is formed on the semiconductor pattern to cover the first and second electrodes, and makes contact with a channel region of the first semiconductor layer to form an interface with the first semiconductor layer.

According to still another aspect of the present invention, a method of manufacturing a TFT is provided as follows. A gate insulation layer is formed on an insulating substrate, and covers a gate electrode. A semiconductor pattern including first and second semiconductor layers that are deposited at different deposition speeds in a vertical direction of the gate insulation layer is formed. A protective layer is formed on the gate insulation layer to cover the semiconductor pattern, the protective layer making contact with one of the first and second semiconductor layers that is deposited at a slower speed than the other, to form an interface with the one of the first and second semiconductor layers in a channel region.

The semiconductor pattern may be formed by depositing the second semiconductor layer on the gate insulation layer at a second deposition speed, and depositing the first semiconductor layer on the second semiconductor layer at a first deposition speed that is slower than the second deposition speed.

Prior to depositing the second semiconductor layer, a third semiconductor layer may further be deposited on the gate insulation layer at a third deposition speed that is slower than the second deposition speed.

Prior to depositing the second semiconductor layer, the third semiconductor layer may be treated with hydrogen plasma.

According to the TFT and the method of manufacturing the TFT, a channel region of a semiconductor pattern forming an interface with a protective layer is deposited at a slower speed than the remainder of the semiconductor pattern to decrease an off current. In addition, when the semiconductor pattern is deposited to form a multilayer structure, only the channel region of the semiconductor pattern forming the interface with the protective layer is deposited at the slower speed. Thus, the manufacturing time may not be increased.

Furthermore, the protective layer as well as the semiconductor pattern is deposited to have the multilayer structure, and a portion of the protective layer, which forms the interface with the semiconductor pattern, is deposited at the slower speed. Thus, the electrical characteristics at the interface between the semiconductor pattern and the protective layer may be greatly improved.

Also, the slowly deposited channel region of the semiconductor pattern forms an interface with the gate insulation layer, so that the electron mobility of the channel region may be increased. The gate insulation layer may form an interface with the first semiconductor layer. Alternatively, other semiconductor layers deposited at a slower speed than the second semiconductor layer may also form an interface with the gate insulation layer.

BRIEF DESCRIPTION OF THE DRAWINGS

The above and other features and advantages of the present invention will become more apparent by describing in detailed example embodiments thereof with reference to the accompanying drawings.

DETAILED DESCRIPTION OF THE INVENTION

Figure 1A:
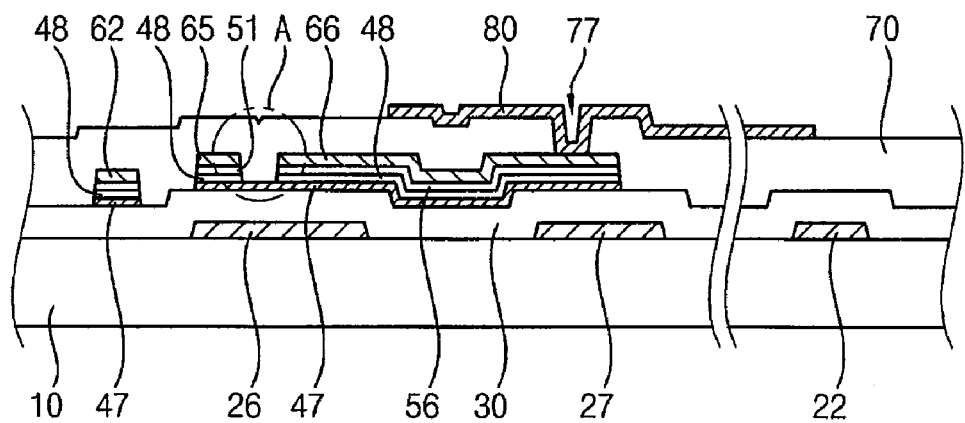
FIG. 1A is a cross-sectional view illustrating a substrate including a thin-film transistor (TFT) in accordance with one embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Thin-film Transistor (TFT)

FIG. 1A is a cross-sectional view illustrating a substrate including a TFT in accordance with one embodiment of the present invention.

Referring to FIG. 1A, a gate pattern 22, 26 and 27 including a gate line 22, a gate electrode 26 and a storage line 27 is formed on a substrate 10.

A gate insulation layer 30 is formed on the gate pattern 22, 26 and 27. The gate insulation layer 30 includes an insulating material such as silicon nitride, silicon oxide, etc. For example, the gate insulation layer 30 may include silicon nitride. The gate insulation layer 30 makes contact with the gate pattern 22, 26 and 27 and a semiconductor pattern to form an interface with the gate pattern 22, 26 and 27 and an interface with the semiconductor pattern. Alternatively, the gate insulation layer 30 may have a double-layer structure including two layers deposited at different speeds. For example, a lower layer of the double-layer structure may be deposited at a fast speed to have a low density, and an upper layer of the double-layer structure may be deposited at a low speed to have a high density.

When a gate on signal Von is applied to the gate electrode 26 through the gate line 22, a channel is formed in the semiconductor pattern making contact with the upper layer of the gate insulation layer 30. Thus, electrical characteristics at a boundary between the semiconductor pattern and the upper layer of the gate insulation layer 30 may be improved by the high density of the upper layer.

For example, when the thickness of the gate insulation layer 30 is about 4,500 Å, the thickness of the upper layer deposited at the fast speed may be about 4,000 Å and the thickness of the lower layer deposited at the low speed may be about 500 Å.

When the gate insulation layer 30 is treated with hydrogen plasma, defects of the gate insulation layer 30 may be decreased and the surface roughness of the gate insulation layer 30 may be improved. Thus, the electron mobility of the semiconductor pattern formed on the gate insulation layer 30 may be improved.

A first semiconductor layer 47 of the semiconductor pattern is formed on the gate insulation layer 30. The first semiconductor layer 47 is deposited at a first deposition speed, and includes hydrogenated amorphous silicon or polysilicon. For example, the first deposition speed may be about 6 to 12 Å/s, and the thickness of the first semiconductor layer 47 may be about 800 Å.

The reason for depositing the first semiconductor layer 47 at a low speed that is the first deposition speed will be explained as follows. When a gate voltage is applied to the gate electrode 26, a channel region is formed in the first semiconductor layer 47 that forms an interface with the protective layer 70. For example, when the first semiconductor layer is deposited at a fast deposition speed of about 15 to about 25 Å/s, defects may be formed in the first semiconductor layer. When the number of the defects in the first semiconductor layer is increased, a leakage current may be increased although the gate voltage is not applied to the gate electrode, thereby decreasing a contrast ratio and increasing afterimages. However, in FIG. 1A, the first semiconductor layer 47 that forms the interface with the protective layer 70 to form the channel region is deposited at the low speed of about 6 to about 12 Å/s, so that the defects and dangling bonds may be decreased. Also, the contrast ratio may be increased and afterimages may be decreased.

The total thickness of the semiconductor pattern may be about 1,800 to about 2,000 Å. When the entire semiconductor pattern is deposited at the low speed of 6 to 12 Å/s, manufacturing time may be increased so that productivity may be decreased.

However, in FIG. 1A, only the first semiconductor layer 47 of the semiconductor pattern, which forms the interface with the protective layer 70 to form the channel region, is deposited at the low speed, and the remainder of the semiconductor pattern, which is a second semiconductor layer, is deposited at a faster speed of about 15 to about 25 Å/s. Thus, the manufacturing time may not be increased, and the off current may be prevented.

Figure 1B:
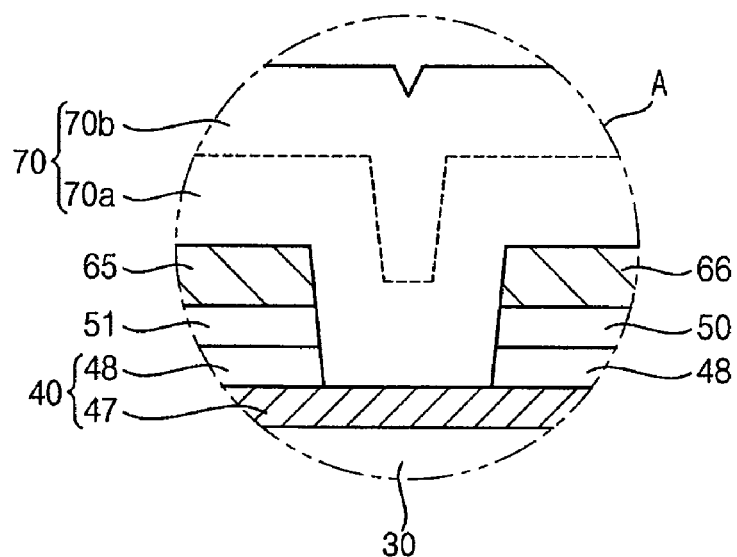
FIG. 1B is an enlarged cross-sectional view illustrating a portion 'A' shown in FIG 1A.

FIG. 1B is an enlarged cross-sectional view illustrating a portion 'A' shown in FIG. 1A.

Referring to FIG. 1B, the semiconductor pattern 40 includes the first semiconductor layer 47 and a second semiconductor layer 48. An upper portion of the first semiconductor layer 47 forms the interface with the protective layer 70.

An ohmic contact layer 51 is formed on the second semiconductor layer 48 and includes a doped amorphous silicon layer. For example, the ohmic contact layer 51 includes two patterns that are divided with respect to the channel region of the semiconductor pattern 40. For example, the ohmic contact layer 51 may be formed through a chemical vapor deposition (CVD) method, and the thickness of the ohmic contact layer 51 may be about 500 Å.

A data pattern including a data line 62, a source electrode 65 and a drain electrode 66 is formed on the ohmic contact layer 51. For example, the data pattern may have a multilayer structure including a molybdenum layer, an aluminum layer on the molybdenum layer and a molybdenum layer on the aluminum layer. Alternatively, the data pattern may have a single-layer structure. The data pattern may be formed through a sputtering method.

A protective layer 70 is formed on the data pattern. The protective layer 70 includes an insulating material such as silicon nitride, silicon oxide, etc. For example, the protective layer 70 may include silicon nitride. The protective layer 70 may have a single-layer structure or a multilayer structure. At least one contact hole 77 is formed through the protective layer 70. The drain electrode is partially exposed through the contact hole 77 to be electrically connected to a pixel electrode 80.

For example, the protective layer 70 may have the multilayer structure having a first protective film 70a and a second protective film 70b. The first protective film 70a is deposited at a slower speed than the second protective film 70b. The first protective film 70a forms an interface with the first semiconductor layer 47. When the first protecting film 70a deposited at the slow speed makes contact with the first semiconductor layer 47 deposited at the slow speed, the electrical characteristics of the semiconductor pattern may be improved and the off current may be decreased.

Referring again to FIG. 1A, the pixel electrode 80 is formed on the protective layer 70. The thickness of the protective layer 70 is about 400 to about 500 Å. The pixel electrode 80 is mechanically and electrically connected to the drain electrode 66 through the contact hole 77. The pixel electrode 80 includes a transparent conductive material. Examples of the transparent conductive material that may be used for the pixel electrode 80 may include indium tin oxide (ITO), indium zinc oxide (IZO), etc.

Figure 2A:
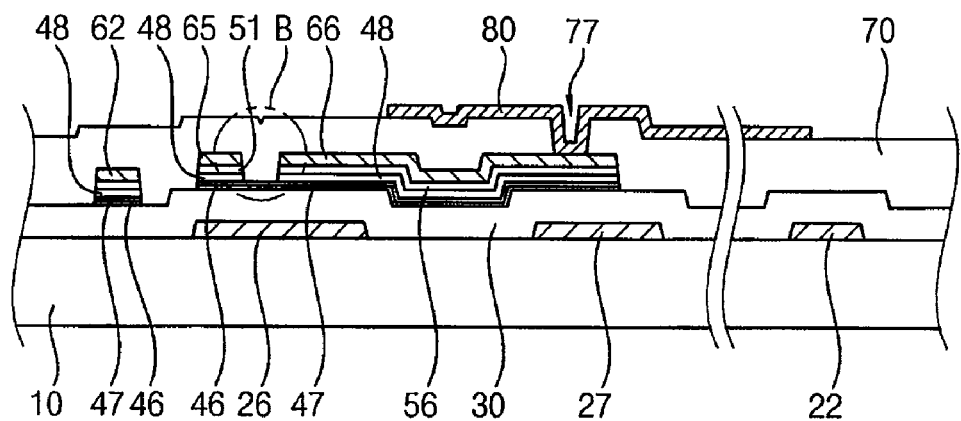
FIG. 2A is a cross-sectional view illustrating a substrate including a TFT in accordance with another embodiment of the present invention.

FIG. 2A is a cross-sectional view illustrating a substrate including a TFT in accordance with another embodiment of the present invention. The TFT of FIG. 2A is substantially the same as in FIGS. 1A and 1B except for a semiconductor pattern. Thus, the same reference numerals will be used to refer to the same or like parts as those described in FIGS. 1A and 1B and any further explanation concerning the above elements will be omitted.

Referring to FIG. 2A, the semiconductor pattern of the TFT includes a second semiconductor layer 46, a first semiconductor layer 47 and a fourth semiconductor layer 48. The second semiconductor layer 46 is deposited on a gate insulation layer 30 at a second deposition speed. The first semiconductor layer 47 is deposited on the second semiconductor layer 46 at a first deposition speed that is smaller than the second deposition speed. The first semiconductor layer 47 forms an interface with the second semiconductor layer 46 and a protective layer 70. For example, the fourth semiconductor layer 48 may be deposited on the first semiconductor layer 47 at a fourth deposition speed faster than the first deposition speed.

According to the present embodiment, the first semiconductor layer 47 that forms the interface with the protective layer 70 and has a channel region is deposited at the first deposition speed that is a slow speed. Thus, electrical characteristics of the boundary between the semiconductor pattern and the protective layer 70 may be improved to decrease an off current.

Figure 2B:
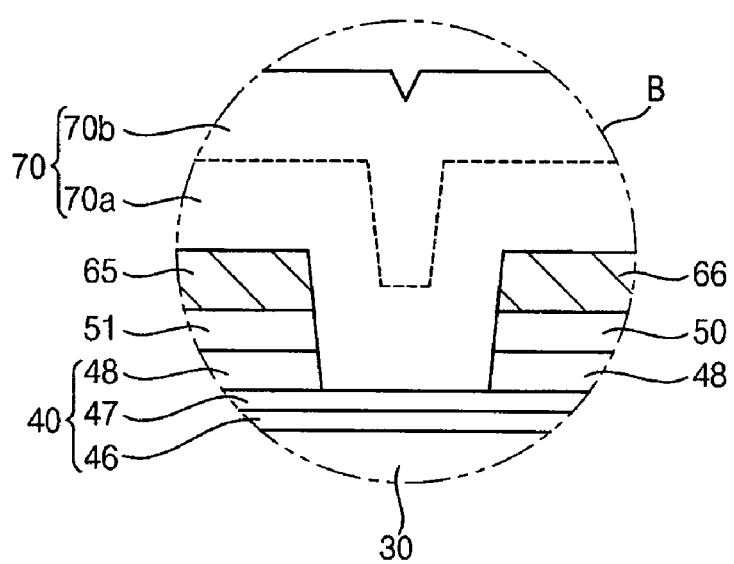
FIG. 2B is an enlarged cross-sectional view illustrating a portion 'B' shown in FIG. 2A.

FIG. 2B is an enlarged cross-sectional view illustrating a portion 'B' shown in FIG. 2A.

In FIG. 2B, the second semiconductor layer 46 deposited at the second deposition speed is formed under the first semiconductor layer 47. The second semiconductor layer 46 is omitted in FIGS. 1A and 1B.

When the second semiconductor layer 46 and the fourth semiconductor layer 48 are formed on lower and upper surfaces of the first semiconductor layer 47, manufacturing time may not be increased. For example, the total thickness of a semiconductor pattern 40 may be about 1,800 to about 2,000 Å. Only a portion of the semiconductor pattern 40 forming the interface with the protective layer 70 is deposited at the slow speed, and the remainder of the semiconductor pattern 40 is deposited at a fast speed. Thus, the electrical characteristics of the semiconductor may be improved although the manufacturing time is not increased. The thickness of the first semiconductor layer 47 may be changed based on an etching ratio between the semiconductor layer 40 and an ohmic contact layer 51 including doped amorphous silicon. For example, an etching amount of the doped amorphous silicon layer may be about 100 Å, and the thickness of the first semiconductor layer 47 may be about 200 Å.

The first deposition speed may be about 6 to 12 Å/s, and the second deposition speed may be about 15 to 25 Å/s. Also, the fourth deposition speed may be about 15 to 25 Å/s.

Figure 3A:
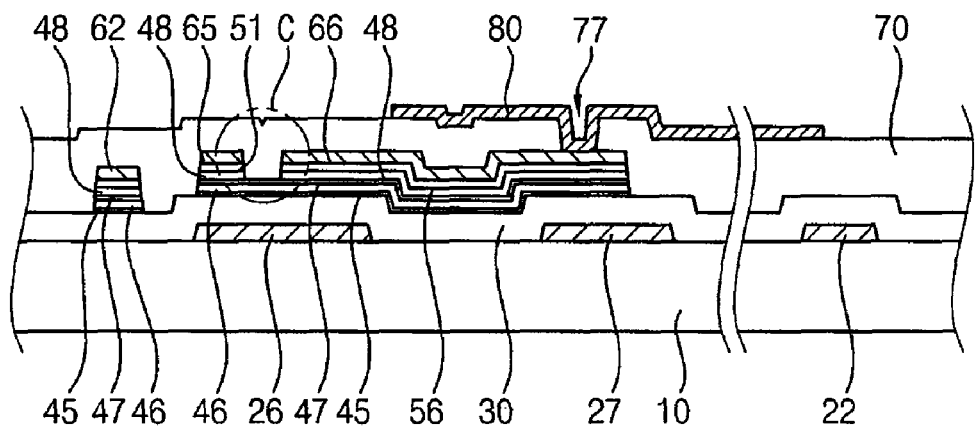
FIG. 3A is a cross-sectional view illustrating a substrate including a TFT in accordance with still another embodiment of the present invention.

FIG. 3A is a cross-sectional view illustrating a substrate including a TFT in accordance with still another embodiment of the present invention. The TFT of FIG. 3A is substantially the same as in FIGS. 2A and 2B except for a semiconductor pattern. Thus, the same reference numerals will be used to refer to the same or like parts as those described in FIGS. 2A and 2B and any further explanation concerning the above elements will be omitted.

Referring to FIG. 3A, the semiconductor pattern includes a second semiconductor layer 46, a first semiconductor layer 47, a third semiconductor layer 45 and a fourth semiconductor layer 48. The second semiconductor layer 46 is deposited on a gate insulation layer 30 at a second deposition speed. The first semiconductor layer 47 is deposited on the second semiconductor layer 46 at a first deposition speed that is slower than the second deposition speed. The first semiconductor layer 47 forms an interface with the second semiconductor layer 46 and an interface with the protective layer 70. The third semiconductor layer 45 is deposited between the second semiconductor layer 46 and the gate insulation layer 30 at a third deposition speed that is slower than the second deposition speed. The third semiconductor layer 45 forms an interface with the second semiconductor layer 46 and an interface with the gate insulation layer 30. The fourth semiconductor layer 48 is deposited between an ohmic contact layer 50 and 51 and the first semiconductor layer 47 at a fourth deposition speed faster than the first deposition speed. The fourth semiconductor layer 48 form an interface with the ohmic contact layer 50 and 51 and an interface with the first semiconductor layer 47.

In FIG. 3A, the first semiconductor layer 47 forming the interface with the protective layer 70 to form the channel region is deposited at the slow speed of the first deposition speed, so that electrical characteristics at the boundary between the semiconductor pattern and the protective layer 70 may be improved and an off current may be decreased.

Figure 3B:
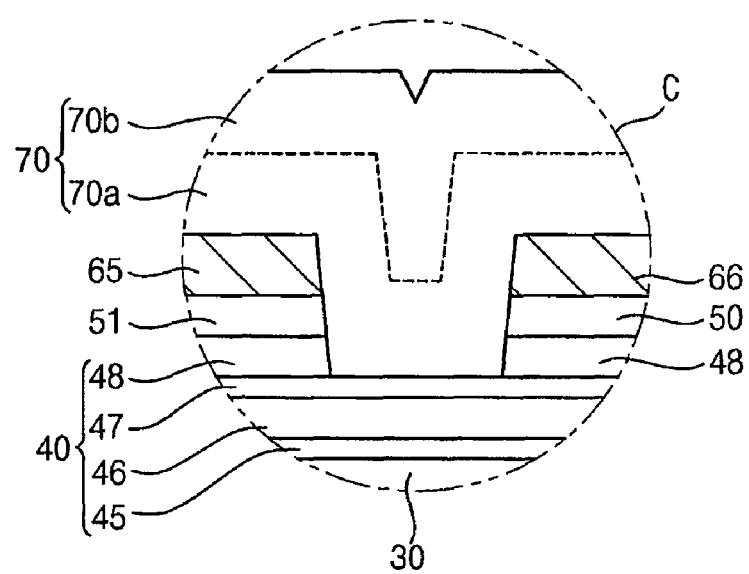
FIG. 3B is an enlarged cross-sectional view illustrating a portion 'C' shown in FIG. 3A.

FIG. 3B is an enlarged cross-sectional view illustrating a portion 'C' shown in FIG. 3A.

Referring to FIG. 3B, the third semiconductor layer 45 deposited at the third deposition speed that is slower than the second deposition speed is formed under the second semiconductor layer 46. The third semiconductor layer 45 is omitted in FIGS. 1A and 1B.

When the third semiconductor layer 45 that is deposited at the slow speed of the third deposition speed to have high density is formed on the gate insulation layer 30, electrical characteristics at an interface between the semiconductor pattern 40 and the gate insulation layer 30 may be improved.

For example, before the second semiconductor layer 46 is deposited, the third semiconductor layer 45 may be treated with hydrogen plasma. Thus, defects in the semiconductor pattern 40 may be decreased and the density of the second semiconductor layer 46 may be increased, so that electron mobility in the channel region may be improved.

The thickness of the first semiconductor layer 47 may be changed based on an etching ratio between the semiconductor layer 40 and an ohmic contact layer 51 including doped amorphous silicon. For example, an etching amount of the doped amorphous silicon layer may be about 100 Å, and the thickness of the first semiconductor layer 47 may be about 200 Å.

The first deposition speeds may be about 6 to 12 Å/s, and the second deposition speed may be about 15 to 25 Å/s. Also, the third deposition speed may be about 6 to 12 Å/s, and the fourth deposition speed may be about 15 to 25 Å/s.

Figure 4A:
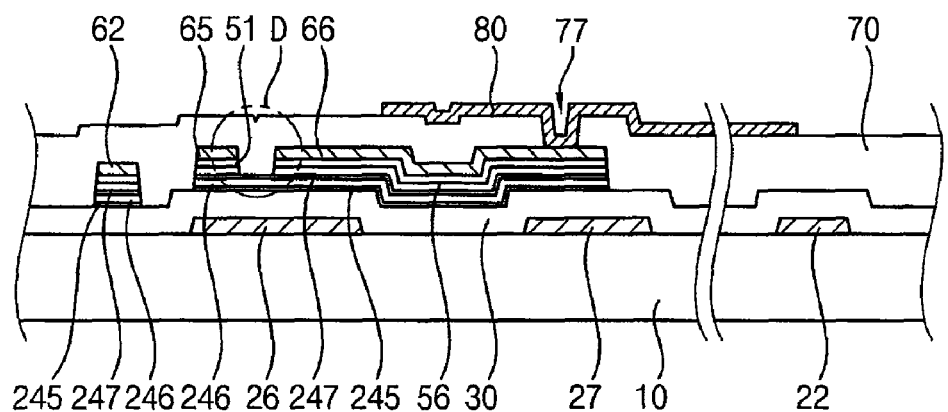
FIG. 4A is a cross-sectional view illustrating a substrate including a TFT in accordance with further still another embodiment of the present invention.

FIG. 4A is a cross-sectional view illustrating a substrate including a TFT in accordance with further still another embodiment of the present invention. The TFT of FIG. 4A is substantially the same as in FIGS. 3A and 3B except for a semiconductor pattern. Thus, the same reference numerals will be used to refer to the same or like parts as those described in FIGS. 3A and 3B and any further explanation concerning the above elements will be omitted.

Referring to FIG. 4A, the semiconductor pattern of the TFT includes a third semiconductor layer 245, a second semiconductor layer 246 and a first semiconductor layer 247. The third semiconductor layer 245 is deposited on a gate insulation layer 30 at a third deposition speed. The second semiconductor layer 246 is deposited on the third semiconductor layer 245 at a second deposition speed faster than the third deposition speed. The first semiconductor layer 247 is deposited on the second semiconductor layer 246 at a first deposition speed that is slower than the second deposition speed. The first semiconductor layer 247 forms an interface with the second semiconductor layer 246 and an interface with a protective layer 70, and makes contact with the second semiconductor layer 246 and the protective layer 70.

In FIG. 4A, the first semiconductor layer 247 forming the interface with the protective layer 70 to form a channel region is deposited at a slow speed of the first deposition speed, so that electrical characteristics between the semiconductor layer and the protective layer 70 may be improved, thereby decreasing an off current. For example, the entire interface between the semiconductor layer and the protective layer 70 may be covered by the first semiconductor layer 247 that is deposited at the slow speed, so that the off current may be decreased.

Figure 4B:
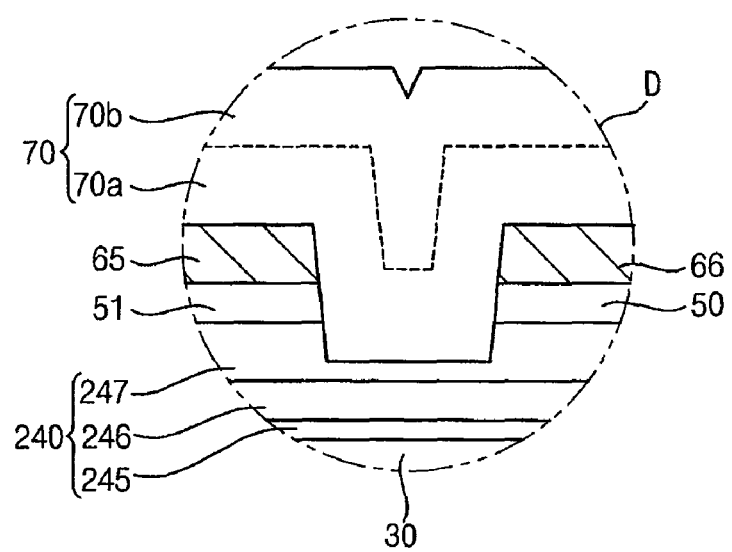
FIG. 4B is an enlarged cross-sectional view illustrating a portion 'D' shown in FIG. 3A.

FIG. 4B is an enlarged cross-sectional view illustrating a portion 'D' shown in FIG 3A.

Referring to FIG. 4B, the semiconductor pattern 240 does not include the fourth semiconductor layer 48 shown in FIG. 3B. The thickness of the first semiconductor layer 247 of FIG. 4B deposited at the first deposition speed is greater than the thickness of the first semiconductor layer 47 of FIGS. 3A and 3B. The first deposition speed is slower than the second deposition speed, and may be substantially the same as the third deposition speed.

Therefore, the semiconductor pattern 240 makes contact with the protecting layer 70 through only the first semiconductor layer 247, so that electrical characteristics between the semiconductor pattern and the protective layer 70 may be greatly improved. Also, the semiconductor pattern 240 makes contact with the ohmic contact layer 51 through only the first semiconductor layer 247, so that electrical characteristics between the semiconductor pattern 240 and the ohmic contact layer 51 are also improved.

Method of Manufacturing a TFT

Hereinafter, a method of manufacturing a TFT will be explained with reference to FIGS. 5 to 15.

FIGS. 5 to 15 are cross-sectional views illustrating a method of manufacturing the TFT shown in FIGS. 3A and 3B.

Figure 5:
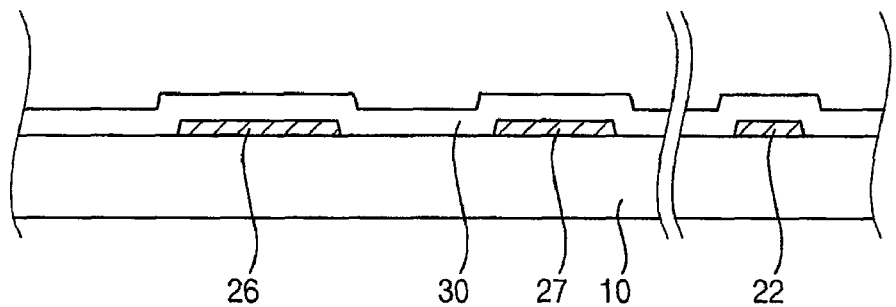
FIGS. 5, 6, 7, 8, 9, 10, 11, 12, 13, 14, and 15 are cross-sectional views illustrating a method of manufacturing the TFT shown in FIGS. 3A and 3B.

FIG. 5 is a cross-sectional view illustrating forming the gate pattern 22, 26 and 27 and the gate insulation layer 30 on the substrate 10 shown in FIGS. 3A and 3B.

Referring to FIG. 5, the gate pattern 22, 26 and 27 including the gate line 22, the gate electrode 26 and the storage line 27 is formed on the substrate 10.

The gate insulation layer 30 including silicon nitride is deposited on the substrate 10, on which the gate pattern 22, 26 and 27 is formed, through a CVD method at the thickness of about 1,500 to about 5,000 Å. The gate insulation layer 30 may have a double-layer structure including two layers deposited at different deposition speeds. For example, a lower layer of the gate insulation layer 30 may be deposited at a fast speed to have a loose structure, and an upper layer of the gate insulation layer 30 may be deposited at a slow speed to have a dense structure. Thus, electrical characteristics at a boundary between the gate insulation layer 30 and the semiconductor pattern may be improved.

For example, when the total thickness of the gate insulation layer 30 is about 4,500 Å, the thickness of the upper layer deposited at the fast speed may be about 4,000 Å and the thickness of the lower layer deposited at the low speed may be about 500 Å.

Figure 6:
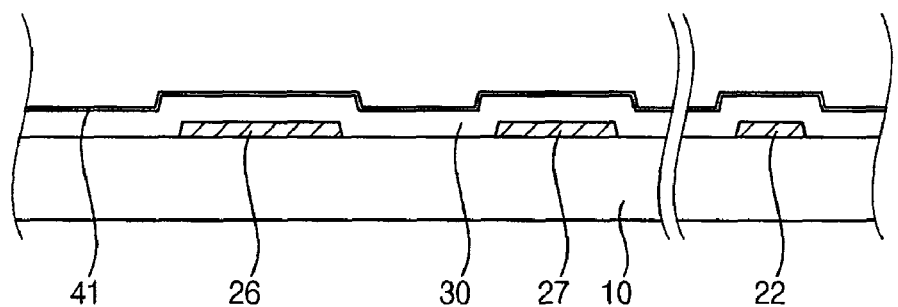

FIG. 6 is a cross-sectional view illustrating forming a third layer 41 for forming the third semiconductor layer on the gate insulation layer 30 shown in FIG. 5.

Referring to FIG. 6, in one example, hydrogenated amorphous silicon or polysilicon is deposited on the gate insulation layer 30 to form the third layer 41 for forming the third semiconductor layer.

The third layer 41 forms an interface with the gate insulation layer 30, and the third deposition speed of the third layer 41 is about 6 to 12 Å/s. The third layer 41 may be deposited at a temperature of about 150 to about 350° C. The thickness of the third layer 41 may be about 100 to about 300 Å. For example, the thickness of the third layer 41 may be about 150 Å. After the third layer 41 for forming the third semiconductor layer is formed, the third layer 41 is treated with hydrogen plasma so that hydrogen atoms may be distributed in the third layer 41.

Figure 7:
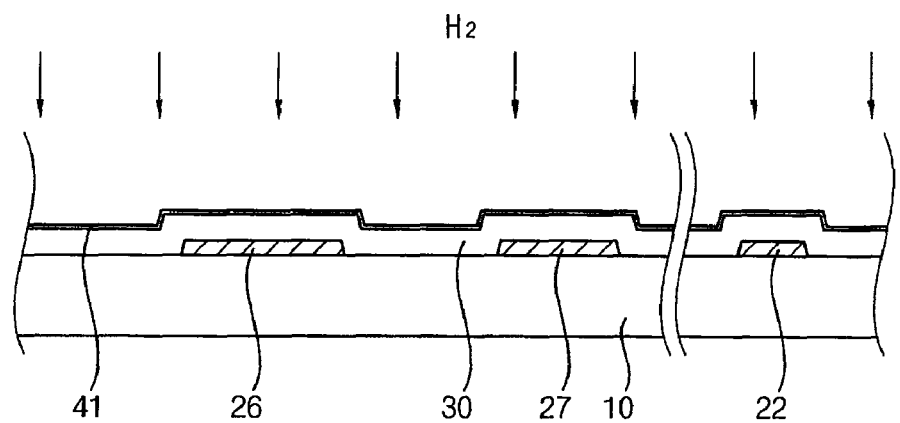

FIG. 7 is a cross-sectional view illustrating treating the third layer 41 for forming the third semiconductor layer with the hydrogen plasma shown in FIG. 6.

Referring to FIG. 7, the third layer 41 deposited on the gate insulation layer 30 is treated with the hydrogen plasma. The hydrogen plasma treatment may be performed in the same chamber as the deposition of the third layer 41. When the third layer 41 for forming the third semiconductor layer is treated with the hydrogen plasma, the density of the third layer 41 may be increased by the hydrogen diffusion so that the electron mobility of the third layer 41 may be improved.

Figure 8:
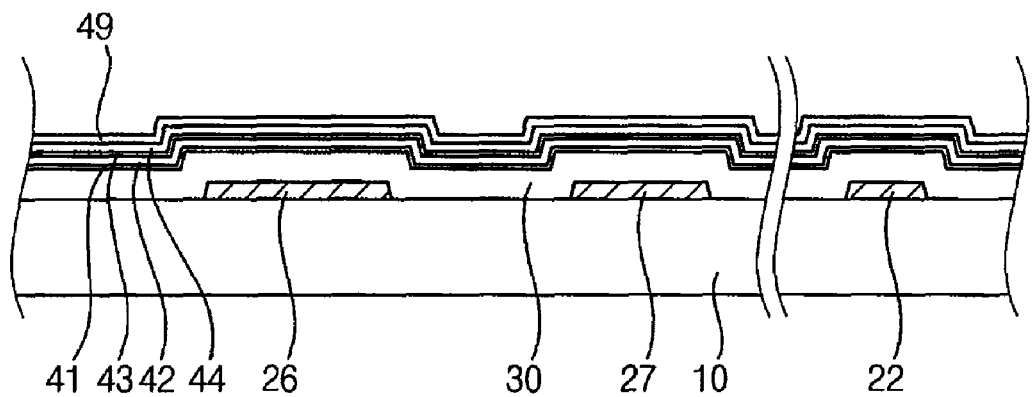

FIG. 8 is a cross-sectional view illustrating forming a second layer 42 for forming the second semiconductor layer, a first layer 43 for forming the first semiconductor layer, a fourth layer 44 for forming the fourth semiconductor layer and a doped amorphous silicon layer 49 on the third layer 41 that is treated with the hydrogen plasma shown in FIG. 7.

Referring to FIG. 8, hydrogenated amorphous silicon or polysilicon is deposited on the third layer 41 that is treated with the hydrogen plasma at the second deposition speed to form the second layer 42 for forming the second semiconductor layer. The second deposition speed is faster than the third deposition speed. When the second deposition speed is faster than the third deposition speed, the manufacturing time may be decreased. For example, the second deposition speed may be about 15 to 25 Å/s.

The first layer 43 for forming the first semiconductor layer is deposited on the second layer 42 for forming the second semiconductor layer at the first deposition speed. For example, the first deposition speed for depositing the second layer 42 may be about 6 to 12 Å/s. The temperature for depositing the second layer 42 may be about 150 to about 350° C.

The first layer 43 forming an interface with the protective layer 70 is deposited at the slow speed of the first deposition speed, so that defects and dangling bonds in the first layer 43 may be decreased. Thus, electrical characteristics between the first layer 43 and the protective layer 70 may be improved, and the off current may be decreased.

The thickness of the first layer 43 for forming the first semiconductor layer may be changed based on the etching ratio between the semiconductor layer 40 and the ohmic contact layer 51 including the doped amorphous silicon. For example, the etching amount of the doped amorphous silicon layer may be about 100 Å, and the thickness of the first semiconductor layer 47 may be about 200 Å.

The fourth layer 44 for forming the fourth semiconductor layer is deposited on the first layer 43 for forming the first semiconductor layer. The fourth layer 44 may be deposited under substantially the same conditions as the first layer 43. Thus, the total thickness of the first, second, third and fourth layers 43, 42, 41 and 44 is about 1,800 to about 2,000 Å.

The doped amorphous silicon layer 49 is deposited on the fourth layer 44 for forming the fourth semiconductor layer. For example, the thickness of the doped amorphous silicon layer 49 may be about 500 Å.

Figure 9:
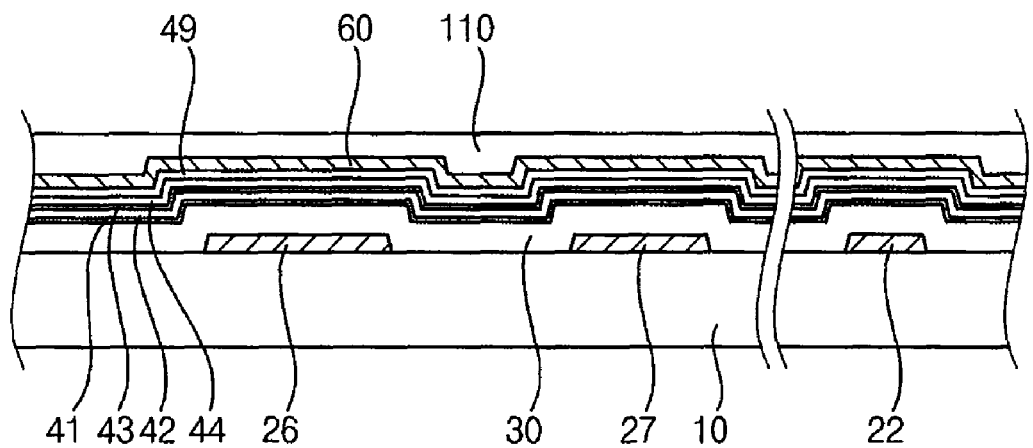

FIG. 9 is a cross-sectional view illustrating forming a conductive layer 60 for forming the data pattern and a photoresist film 110 on the doped amorphous silicon layer 49 shown in FIG. 8.

Referring to FIG. 9, the conductive layer 60 for forming the data pattern is deposited on the doped amorphous silicon layer 49 through a sputtering method. The conductive layer 60 may have the multilayer structure including the molybdenum/aluminum/molybdenum layers. The photoresist film 110 is coated on the conductive layer 60.

Figure 10:
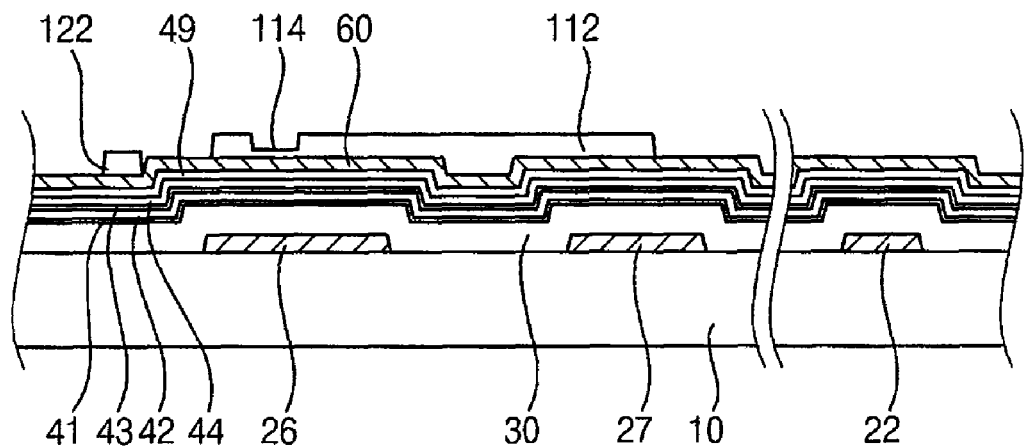
Figure 11:
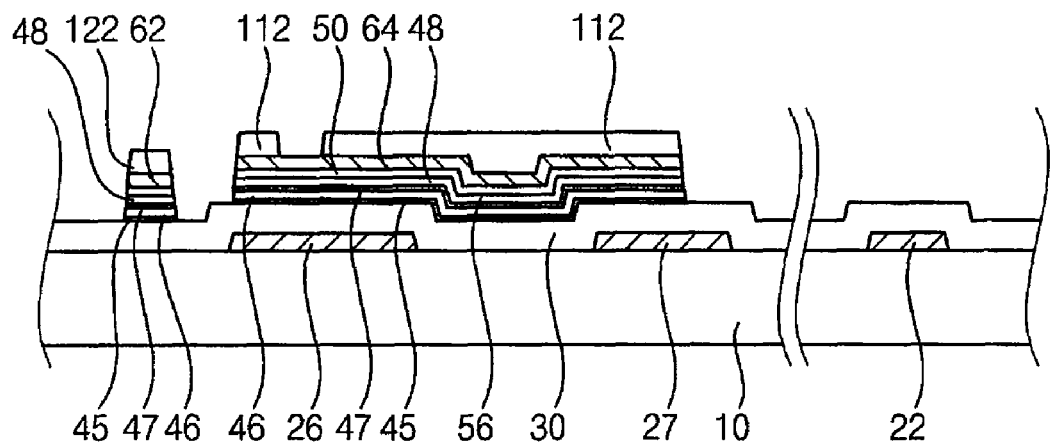

FIG. 10 is a cross-sectional view illustrating forming photoresist patterns 112 and 114 from the photoresist film 110 shown in FIG. 9. FIG. 11 is a cross-sectional view illustrating partially removing the conductive layer 60 for forming the data pattern, the doped amorphous silicon layer 49, the first, second, third and fourth layers 41, 42, 43 and 44 using the photoresist patterns 112 and 114.

Referring to FIGS. 10 and 11, the photoresist film 110 is exposed using a photo mask (not shown), and the exposed photoresist film 110 is developed to form the photoresist patterns 112 and 114. A second region 114 of the photoresist patterns 112 and 114 between the source and drain electrodes 65 and 66 (shown in FIG. 13) corresponding to the channel region of the TFT has smaller thickness than a first region 112 of the photoresist patterns 112 and 114 corresponding to the data pattern. The remainder of the photoresist film 110 is removed. A ratio between the thickness of the first region 112 of the photoresist patterns 112 and 114 and the thickness of the second region 114 of the photoresist patterns 112 and 114 may be changed by etching conditions of subsequent etching processes. For example, the thickness of the second region 114 may be about one half of the thickness of the first region 112.

The thickness difference between the first and second regions 112 and 114 of the photoresist patterns 112 and 114 may be controlled by various methods. For example, the photo mask may have slits, matrix patterns, a translucent reticle, etc., to control the amount of the light irradiated onto the photoresist film 110.

Referring to FIG. 11, the conductive layer 60 for forming the data pattern is etched. The photoresist patterns 112 and 114 may be used as an etching mask. Examples of an etchant used for etching the conductive layer 60 may include phosphoric acid, nitric acid, acetic acid, etc.

Then, the conductive layer 60 except for the data line 62 and a source/drain pattern 64 is removed, so that the doped amorphous silicon layer 49 is exposed through the data line 62 and the source/drain pattern 64. The data line 62 and the source/drain pattern 64 have substantially the same shape as the data pattern 62, 65 and 66 except for the channel region.

The exposed portion of the doped amorphous silicon layer 49 and a portion of the first, second, third and fourth layers 41, 42, 43 and 44 corresponding to the exposed portion are removed through a dry etching method using the photoresist patterns 112 and 114 as an etching mask to form the doped amorphous silicon pattern 50, the first, second, third and fourth semiconductor layers 45, 46, 47 and 48. The gate insulation layer 30 is not etched by dry etching the doped amorphous silicon layer 49 and the first, second, third and fourth layers 41, 42, 43 and 44. For example, the etchant for the dry etching may include a mixture gas of $SF_6$ and HCl, a mixture gas of $SF_6$ and $O_2$, etc.

The second region 114 of the photoresist patterns 112 and 114 is removed by the dry etching. For example, the second region 114 may be simultaneously removed with the doped amorphous silicon layer 49 and the first, second, third and fourth layers 41, 42, 43 and 44. The thickness of the first region 112 of the photoresist patterns 112 and 114 may be decreased by the dry etching.

For example, the substrate may be ashed to remove remaining photoresist in the second region 114 on the source/drain pattern 64.

Figure 12:
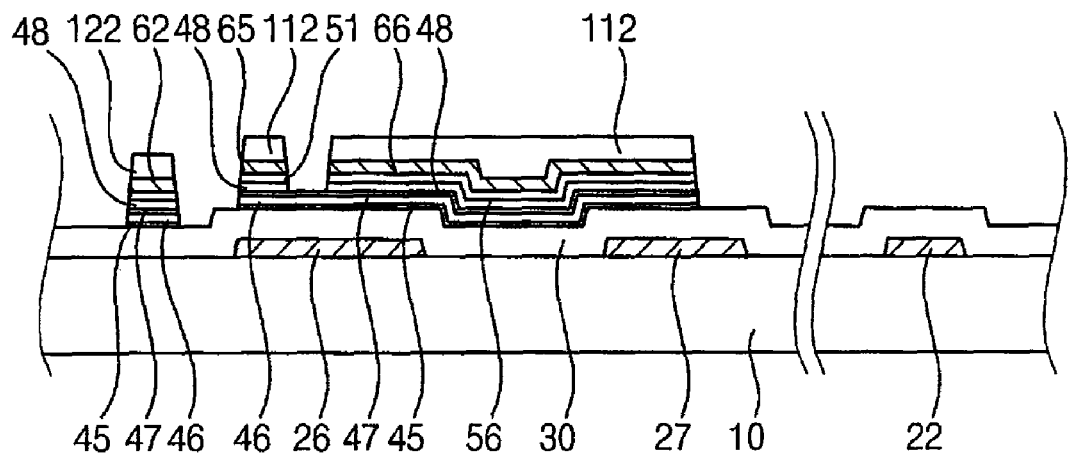

FIG. 12 is a cross-sectional view illustrating forming the source electrode 65 and the drain electrode 66 from the source/drain pattern 64 shown in FIG. 11.

Referring to FIG. 12, a portion of the source/drain pattern 64 in the second region 114 (shown in FIG. 10) is removed to form the source electrode and the drain electrode 66 that are divided with respect to the channel region.

A portion of the doped amorphous silicon pattern 50 between the source electrode 65 and the drain electrode 66 is removed to form the ohmic contact layer 51 and to expose the first semiconductor layer 47 in the channel region. For example, the portion of the doped amorphous silicon pattern 50 may be dry etched using an etchant such as a mixture gas of $CF_4$ and HCl, a mixture gas of $CF_4$ and $O_2$, a mixture gas of $SF_6$ and $Cl_2$, etc.

Alternatively, after the doped amorphous silicon pattern 50 is etched, the exposed surface of the first semiconductor layer 47 may be treated using oxygen plasma to stabilize the surface of the first semiconductor layer 47.

Figure 13:
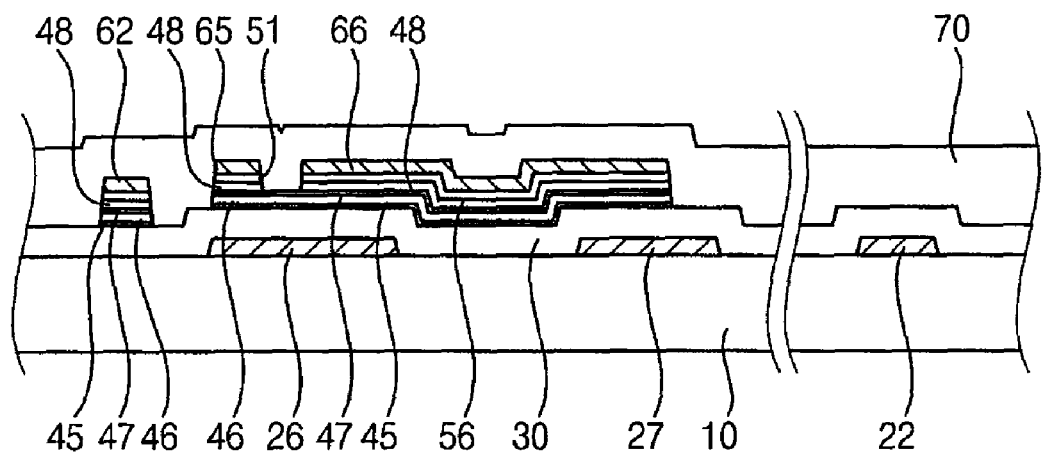
Figure 14:
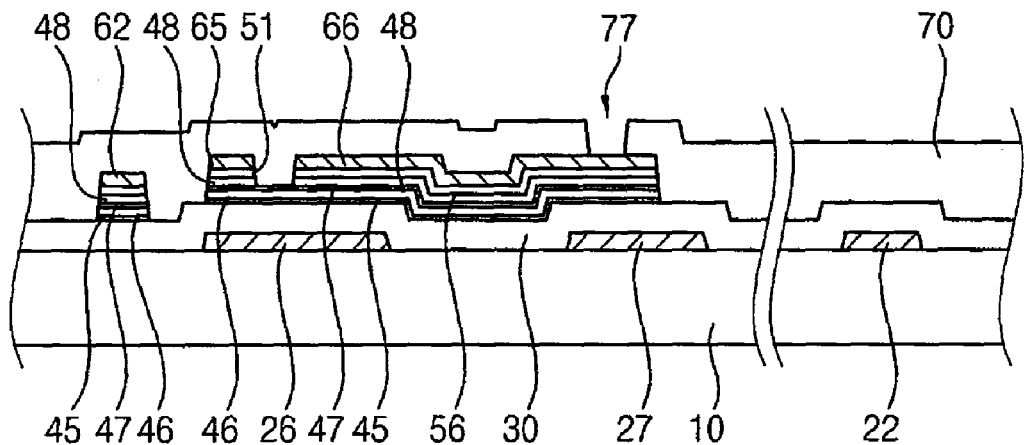

FIG. 13 is a cross-sectional view illustrating forming the protective layer 70 on the substrate 10 shown in FIG. 12. FIG. 14 is a cross-sectional view illustrating forming the contact hole 77 through the protective layer 70 shown in FIG. 13.

Referring to FIGS. 13 and 14, remaining photoresist in the first region 112 is stripped, and the protective layer 70 is formed on the entire surface of the insulating substrate 10. The protective layer 70 may have a single-layer structure or a multilayer structure. The protective layer 70 may include silicon nitride.

When the protective layer 70 has the multilayer structure, the protective layer 70 may have a double-layer structure including two layers deposited at different deposition speeds. For example, a lower layer of the protective layer 70 may make contact with the first semiconductor layer 47 to form the interface with the first semiconductor layer 47, and is deposited at the slow speed. When the lower layer is deposited at the slow speed, the density of the lower layer may be increased and the lower layer may have good electrical characteristics. Thus, electrical characteristics at the boundary between the semiconductor pattern and the protective layer 70 may be improved.

Referring to FIG. 14, the protective layer 70 is etched through a photolithography process to form the contact hole 77 through which the drain electrode 66 is partially exposed.

Figure 15:
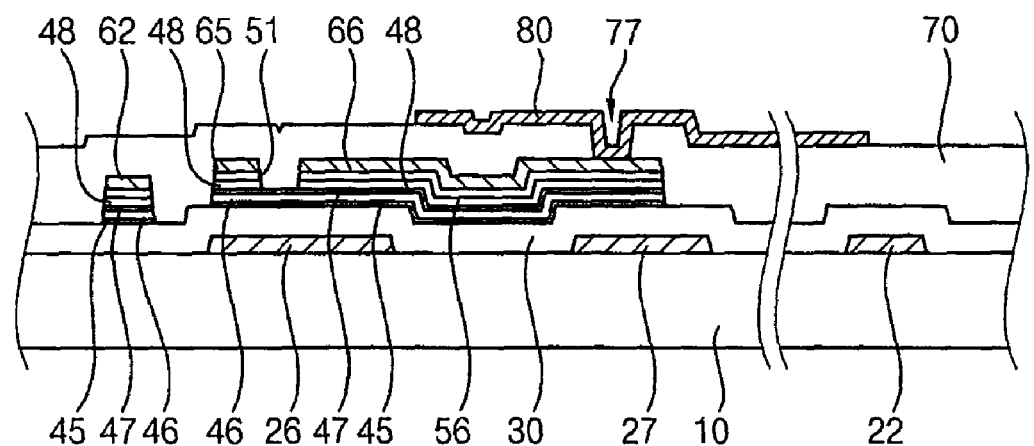

FIG. 15 is a cross-sectional view illustrating forming the pixel electrode 80 on the protective layer 70 having the contact hole 77 shown in FIG. 14.

Referring to FIG. 15, a transparent conductive layer is deposited on the protective layer 70 having the contact hole 77 at the thickness of about 400 to about 500 Å. The transparent conductive layer is patterned through a photolithography process to form the pixel electrode 80 electrically and mechanically connected to the drain electrode 66 through the contact hole 77. Thus, a TFT substrate is completed. Examples of a transparent conductive material that may be used for the pixel electrode 80 include indium tin oxide (ITO), indium zinc oxide (IZO), etc.

Hereinafter, a method of manufacturing a TFT will be explained with reference to FIGS. 16 to 20. In the present embodiment, the TFT is substantially the same as in FIGS. 3A and 3B except for a semiconductor pattern. Thus, any further explanation concerning the above elements will be omitted.

FIGS. 16 to 20 are cross-sectional views illustrating a method of manufacturing the TFT in accordance with another embodiment of the present invention.

The method of manufacturing the TFT of FIGS. 16 to 20 is substantially the same as in FIGS. 5 to 15 except for forming the semiconductor pattern. Thus, the same reference numerals will be used to refer to the same or like parts as those described in FIGS. 5 to 15 and any further explanation concerning the above elements will be omitted.

Figure 16:
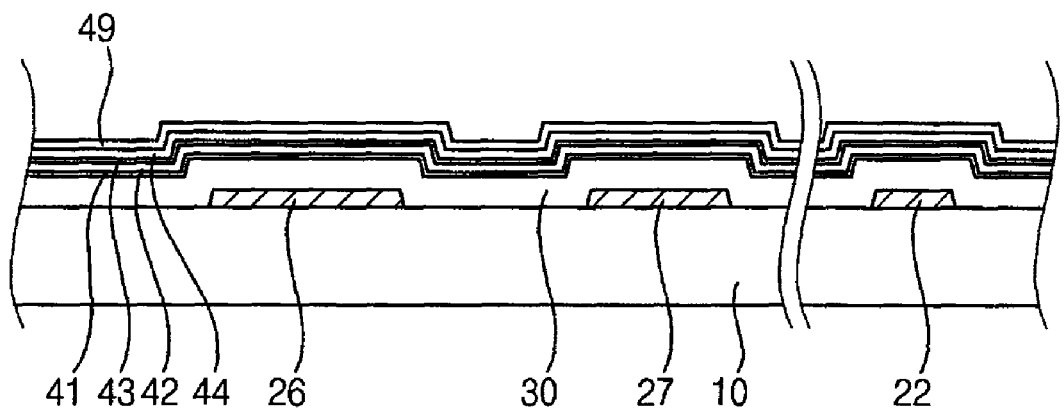
FIGS. 16, 17, 18, 19 and 20 are cross-sectional views illustrating a method of manufacturing the TFT in accordance with another embodiment of the present invention.

FIG. 16 is a cross-sectional view illustrating forming a gate pattern 22, 26 and 27, a gate insulation layer 30, a third layer 41 for forming a third semiconductor layer, a second layer 42 for forming a second semiconductor layer, a first layer 43 for forming a first semiconductor layer, a fourth layer 44 for forming a fourth semiconductor layer and a doped amorphous silicon layer 49 in accordance with another embodiment of the present invention.

Referring to FIG. 16, the gate pattern 22, 26 and 27 including a gate line 22, a gate electrode 26 and a storage line 27 and the gate insulation layer 30 are formed on the substrate 10. The gate insulation layer 30 may include silicon nitride.

The third layer 41 is formed by depositing hydrogenated amorphous silicon or poly silicon is deposited on the gate insulation layer 30 at a third deposition speed. The third layer 41 is deposited under substantially the same conditions such as the third deposition speed, the temperature, the thickness, etc., as the third layer shown in FIG. 6.

The third layer 41 is treated with hydrogen plasma. The hydrogen plasma treatment is performed under substantially the same conditions as the hydrogen plasma treatment shown in FIG. 7. When the third layer 41 is treated with the hydrogen plasma, the density of the third layer 41 may be increased by the hydrogen diffusion so that the electron mobility of the third layer 41 may be improved.

Hydrogenated amorphous silicon is deposited on the third layer 41 at the second deposition speed that is treated with the hydrogen plasma to form the second layer 42 for forming the second semiconductor layer. The second deposition speed is faster than the third deposition speed. The first layer 43 for forming the first semiconductor layer is deposited on the second layer 42 for forming the second semiconductor layer at a first deposition speed. The first deposition speed is slower than the second deposition speed. The second and first layers 42 and 43 are deposited under substantially the same conditions as the second and first layers 42 and 43 shown in FIG. 8.

The fourth layer 44 for forming the fourth semiconductor layer is deposited on the first layer 43 for forming the first semiconductor layer. The fourth layer 44 may be deposited under substantially the same deposition conditions as the second layer 42 that is formed under the first layer 43. The doped amorphous silicon layer 49 is deposited on the fourth layer 44 under substantially the same deposition conditions as the doped amorphous silicon layer 49 shown in FIG. 8.

Figure 17:
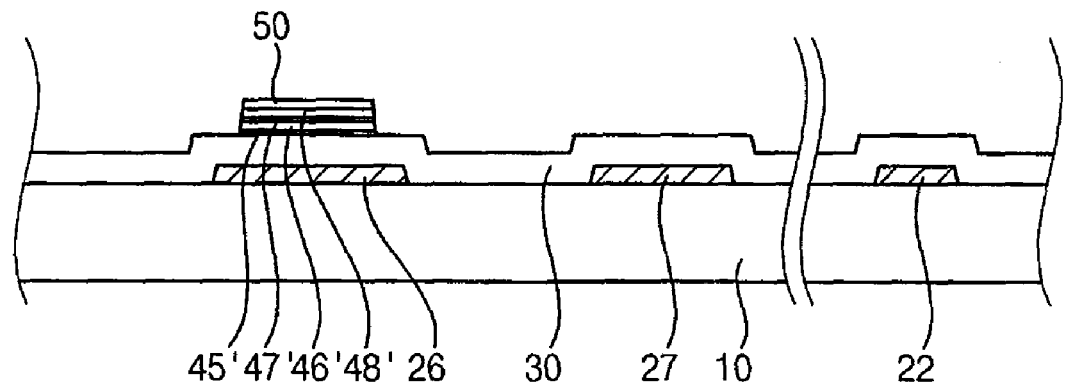

FIG. 17 is a cross-sectional view illustrating partially removing the doped amorphous silicon layer 49 and the first, second, third and fourth layers 43, 42, 41 and 44 shown in FIG. 16.

Referring to FIG. 17, the doped amorphous silicon layer 49 and the first, second, third and fourth layers 43, 42, 41 and 44 are patterned using a photolithography process to form a first semiconductor layer 45', a second semiconductor layer 46', a third semiconductor layer 47', a fourth semiconductor layer 48' and a doped amorphous silicon pattern 50 on the gate electrode 26. The first, second, third and fourth semiconductor layers 45', 46', 47' and 48' and the doped amorphous silicon pattern 50 are overlapped with the gate electrode 26, and have an island shape.

Figure 18:
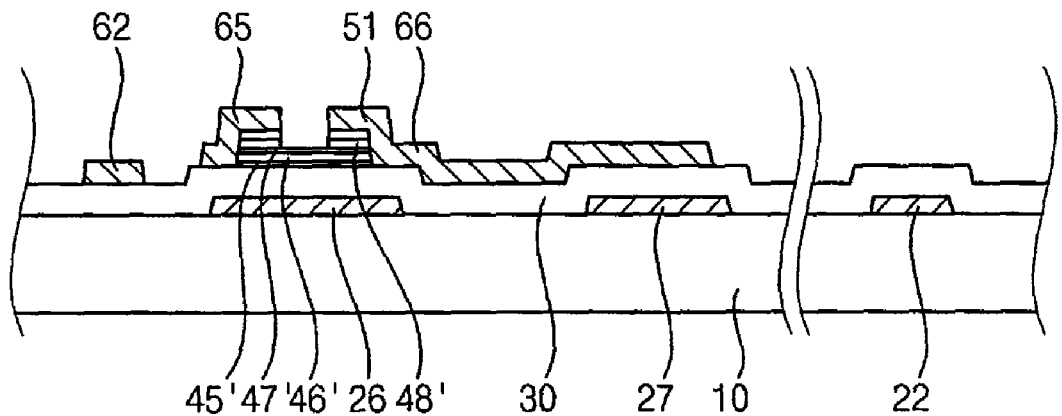

FIG. 18 is a cross-sectional view illustrating forming a data pattern 62, 65 and 66 on the substrate 10 shown in FIG. 17.

Referring to FIG. 18, the data pattern 62, 65 and 66 is formed on the substrate 10 on which the gate pattern, the gate insulation layer 30, the first to fourth semiconductor layers 45', 46', 47' and 48' and the doped amorphous silicon pattern 50 through a sputtering method.

The data pattern 62, 65 and 66 is divided with respect to the gate electrode 26 to form the source electrode 55 and the drain electrode 56.

The doped amorphous silicon pattern 50 is partially etched to form an ohmic contact layer 51, and the first semiconductor layer 47' in a channel region between the source and drain electrodes 55 and 56 is exposed.

Figure 19:
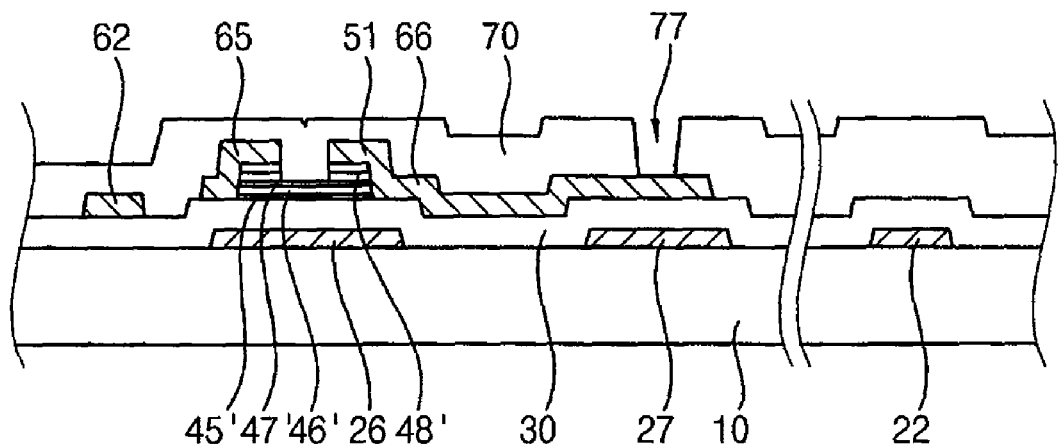

FIG. 19 is a cross-sectional view illustrating a protective layer 70 on the substrate 10 shown in FIG. 18.

Referring to FIG. 19, an inorganic material such as silicon nitride is deposited on the substrate 10 on which the data pattern 62, 65 and 66 is formed to form the protective layer 70. The protective layer 70 may have a single-layer structure or a multilayer structure. The protective layer 70 is partially etched through a photolithography process to form a contact hole 77. The protective layer 70 may have a double-layer structure including two layers deposited at different deposition speeds.

Figure 20:
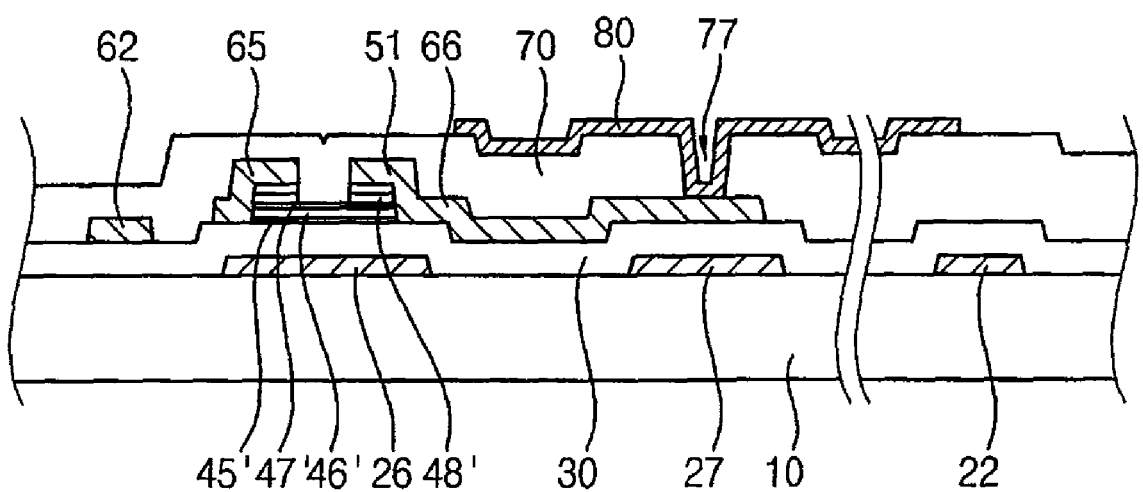

FIG. 20 is a cross-sectional view illustrating forming a pixel electrode 80 on the protective layer 70 having the contact hole 77.

Referring to FIG. 20, a transparent conductive layer is deposited on the protective layer 70 having the contact hole 77. Examples of a transparent conductive material that may be used for the transparent conductive layer include indium tin oxide (ITO), indium zinc oxide (IZO), etc. The transparent conductive layer is patterned through a photolithography process to form the pixel electrode 80 making electrical and mechanical contact with the drain electrode 66.

Hereinafter, a method of manufacturing a TFT will be explained with reference to FIGS. 21 to 25. In the present embodiment, the TFT is substantially the same as in FIGS. 4A and 4B except for a semiconductor pattern. Thus, any further explanation concerning the above elements will be omitted.

FIGS. 21 to 25 are cross-sectional views illustrating a method of manufacturing a TFT in accordance with another embodiment of the present invention.

The method of manufacturing the TFT of FIGS. 21 to 25 is substantially the same as in FIGS. 5 to 15 except for forming the semiconductor pattern. Thus, the same reference numerals will be used to refer to the same or like parts as those described in FIGS. 5 to 15 and any further explanation concerning the above elements will be omitted.

In the manufacturing processes of the present embodiment, the manufacturing processes before the doped amorphous silicon layer 49 is formed are substantially the same as shown in FIGS. 6 to 9.

Figure 21:
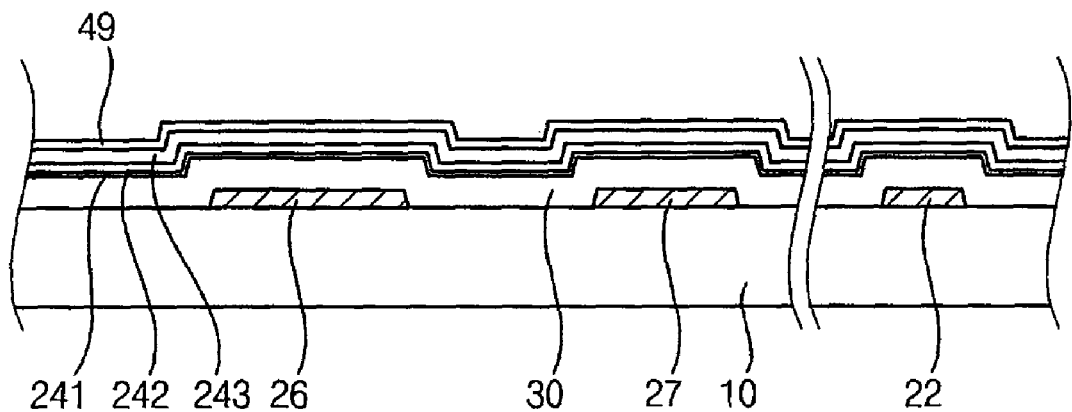
FIGS. 21, 22, 23, 24, and 25 are cross-sectional views illustrating a method of manufacturing the TFT shown in FIGS. 4A and 4B.

FIG. 21 is a cross-sectional view illustrating forming the gate pattern 22, 26 and 27, the gate insulation layer 30, a third layer 241 for forming the third semiconductor layer, a second layer 242 for forming the second semiconductor layer, a first layer 243 for forming the first semiconductor layer and a doped amorphous silicon layer 49.

Referring to FIG. 21, the gate pattern 22, 26 and 27 including the gate line 22, the gate electrode 26 and the storage line 27 and the gate insulation layer 30 are formed on the substrate 10. The gate insulation layer 30 may include silicon nitride.

Referring to FIG. 21, the gate pattern 22, 26 and 27 including the gate line 22, the gate electrode 26 and the storage line 27 and the gate insulation layer 30 are formed on the substrate 10. The gate insulation layer 30 may include silicon nitride.

The third layer 241 is formed by depositing hydrogenated amorphous silicon or poly silicon is deposited on the gate insulation layer 30 at the third deposition speed. The third layer 241 is deposited under substantially the same conditions such as the third deposition speed, the temperature, the thickness, etc., as the third layer shown in FIG. 6.

The third layer 241 is treated with hydrogen plasma. The hydrogen plasma treatment is performed under substantially the same conditions as the hydrogen plasma treatment shown in FIG. 7. When the third layer 241 is treated with the hydrogen plasma, the density of the third layer 241 may be increased by the hydrogen diffusion so that the electron mobility of the third layer 41 may be improved.

Hydrogenated amorphous silicon is deposited on the third layer 241 at the second deposition speed that is treated with the hydrogen plasma to form the second layer 242 for forming the second semiconductor layer. The second deposition speed is faster than the third deposition speed. The first layer 243 for forming the first semiconductor layer is deposited on the second layer 242 for forming the second semiconductor layer at the first deposition speed. The first deposition speed is slower than the second deposition speed. The second and first layers 242 and 243 are deposited under substantially the same conditions as the second and first layers 242 and 243 shown in FIG. 8.

The fourth layer 44 (shown in FIG. 16) is omitted in the present embodiment.

Figure 22:
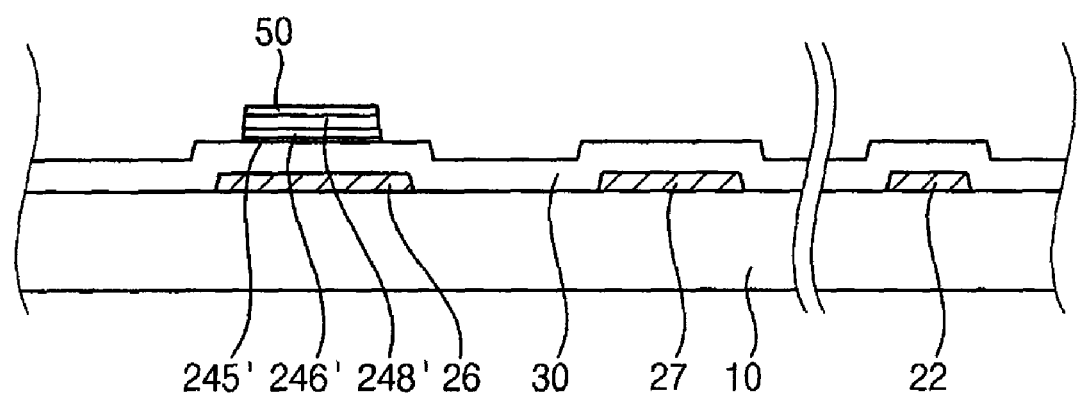

FIG. 22 is a cross-sectional view illustrating partially removing the doped amorphous silicon layer 49 and the first, second and third layers 243, 242 and 241 shown in FIG. 21.

Referring to FIG. 22, the doped amorphous silicon layer 49 and the first, second and third layers 243, 242 and 244 are patterned using a photolithography process to form a first semiconductor layer 245', a second semiconductor layer 246' and a third semiconductor layer 247' and a doped amorphous silicon pattern 50 on the gate electrode 26. The first, second and third semiconductor layers 245', 246' and 247' and the doped amorphous silicon pattern 50 are overlapped with the gate electrode 26, and have an island shape.

Figure 23:
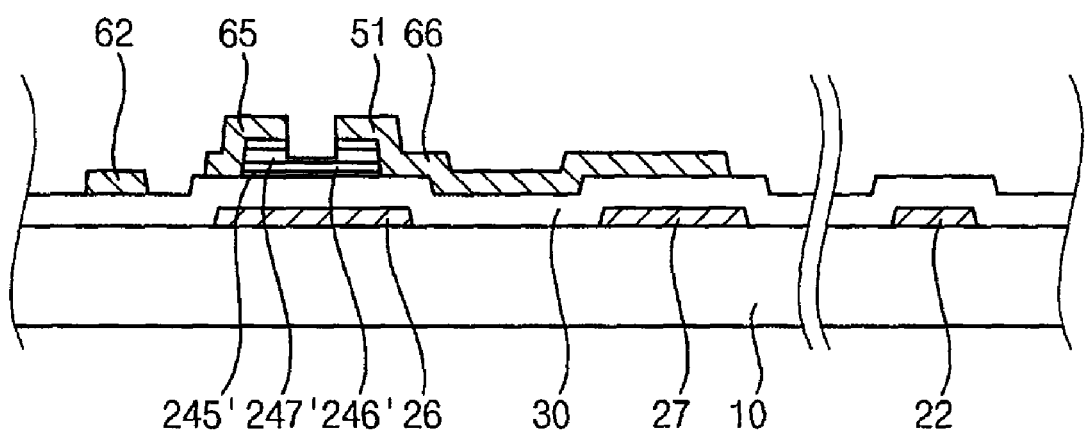

FIG. 23 is a cross-sectional view illustrating forming a data pattern 62, 65 and 66 on the substrate 10 shown in FIG. 22.

Referring to FIG. 23, the data pattern 62, 65 and 66 is formed on the substrate 10 on which the gate pattern, the gate insulation layer 30, the first to third semiconductor layers 245', 246' and 247' and the doped amorphous silicon pattern 50 through a sputtering method.

The data pattern 62, 65 and 66 is divided with respect to the gate electrode 26 to form the source electrode 55 and the drain electrode 56.

The doped amorphous silicon pattern 50 is partially etched to form an ohmic contact layer 51, and the first semiconductor layer 247' in a channel region between the source and drain electrodes 55 and 56 is exposed.

Figure 24:
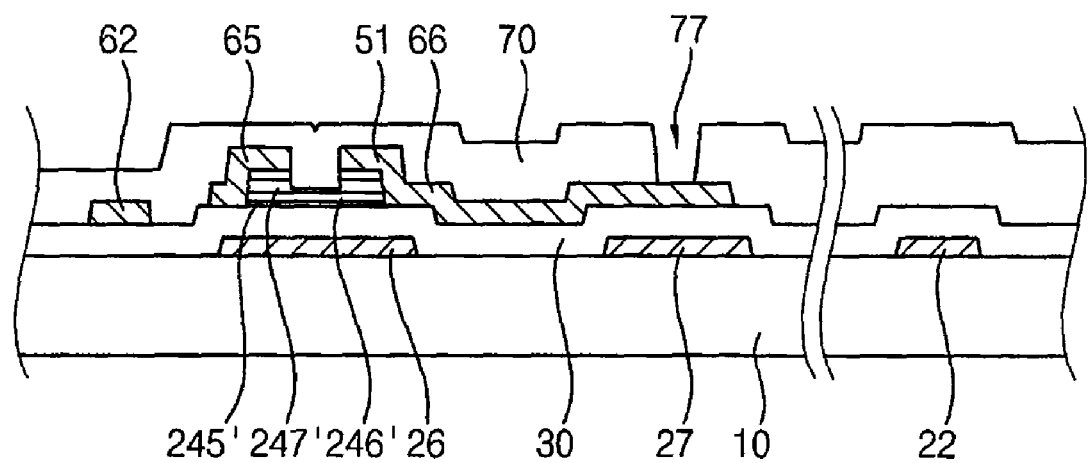

FIG. 24 is a cross-sectional view illustrating a protective layer 70 on the substrate 10 shown in FIG. 23.

Referring to FIG. 24, an inorganic material such as silicon nitride is deposited on the substrate 10 on which the data pattern 62, 65 and 66 is formed to form the protective layer 70. The protective layer 70 may have a single-layer structure or a multilayer structure. The protective layer 70 is partially etched through a photolithography process to form a contact hole 77 through which the drain electrode 66 of the data pattern 62, 65 and 66 is partially exposed. The protective layer 70 may have a double-layer structure including two layers deposited at different deposition speeds.

Figure 25:
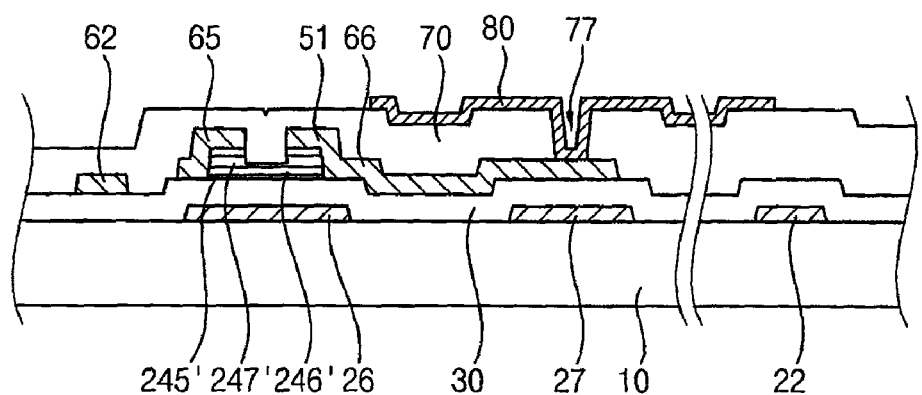

FIG. 25 is a cross-sectional view illustrating forming a pixel electrode 80 on the protective layer 70 having the contact hole 77.

Referring to FIG. 25, a transparent conductive layer is deposited on the protective layer 70 having the contact hole 77. Examples of a transparent conductive material that may be used for the transparent conductive layer include indium tin oxide (ITO), indium zinc oxide (IZO), etc. The transparent conductive layer is patterned through a photolithography process to form the pixel electrode 80 making electrical and mechanical contact with the drain electrode 66.

TABLE 1

| No. of Semiconductor Patterns | Thickness of 1st Semiconductor Layer (Å) | Thickness of 2nd Semiconductor Layer (Å) | Thickness of 3rd Semiconductor Layer (Å) | Thickness of 4th Semiconductor Layer (Å) | Deposition Time (s) |
| --- | --- | --- | --- | --- | --- |
| 1 | 600 | 400 | 100 | 300 | 102 |
| 2 | 800 | 400 | 100 | 100 | 110 |

TABLE 1-continued

| No. of Semiconductor Patterns | Thickness of 1st Semiconductor Layer (Å) | Thickness of 2nd Semiconductor Layer (Å) | Thickness of 3rd Semiconductor Layer (Å) | Thickness of 4th Semiconductor Layer (Å) | Deposition Time (s) |
|---|---|---|---|---|---|
| 3 | 0 | 0 | 700 | 1300 | 134 |
| 4 | 600 | 600 | 100 | 100 | 102 |
| 5 | 600 | 500 | 100 | 200 | 102 |
| 6 | 600 | 300 | 100 | 400 | 102 |

EXAMPLE 1

In Example 1, the TFTs shown in FIGS. 1 to 4B were tested, and thicknesses of the first to fourth semiconductor layers were changed. The first and third semiconductor layers were formed at a pressure of about 3,000 mTorr using an electric power of about 150 W by injecting a $H_2$ gas having a flow rate of about 520 sccm and a $SiH_4$ gas having a flow rate of about 150 sccm.

Table 1 represents semiconductor patterns including the first to fourth semiconductor layers deposited at various thicknesses during various times.

Referring to Table 1, the semiconductor pattern 1 included the first semiconductor layer having the thickness of about 600 Å, the second semiconductor layer having the thickness of about 400 Å, the third semiconductor layer having the thickness of about 100 Å, and the fourth semiconductor layer having the thickness of about 300 Å, and the deposition time of the semiconductor pattern 1 was about 102 s.

The semiconductor pattern 2 included the first semiconductor layer having the thickness of about 800 Å, the second semiconductor layer having the thickness of about 400 Å, the third semiconductor layer having the thickness of about 100 Å, and the fourth semiconductor layer having the thickness of about 100 Å, and the deposition time of the semiconductor pattern 2 was about 110 s.

The semiconductor pattern 3 included the third semiconductor layer having the thickness of about 700 Å, and the fourth semiconductor layer having the thickness of about 1,300 Å. The first semiconductor layer and the second semiconductor layer were omitted. The deposition time of the semiconductor pattern 3 was about 134 s.

The semiconductor pattern 4 included the first semiconductor layer having the thickness of about 600 Å, the second semiconductor layer having the thickness of about 600 Å, the third semiconductor layer having the thickness of about 100 Å, and the fourth semiconductor layer having the thickness of about 100 Å, and the deposition time of the semiconductor pattern 4 was about 102 s.

The semiconductor pattern 5 included the first semiconductor layer having the thickness of about 600 Å, the second semiconductor layer having the thickness of about 500 Å, the third semiconductor layer having the thickness of about 100 Å, and the fourth semiconductor layer having the thickness of about 200 Å, and the deposition time of the semiconductor pattern 5 was about 102 s.

The semiconductor pattern 6 included the first semiconductor layer having the thickness of about 600 Å, the second semiconductor layer having the thickness of about 300 Å, the third semiconductor layer having the thickness of about 100 Å, and the fourth semiconductor layer having the thickness of about 400 Å, and the deposition time of the semiconductor pattern 6 was about 102 s.

Table 2 represents electrical characteristics of the TFTs having the semiconductor patterns 1, 2, 3, 4, 5 and 6 of Table 1. In Table 2, the gate voltage was about −20 V, and a voltage difference $V_{DS}$ between the source electrode and the drain electrode was about 10 V.

TABLE 2

| No. of Semiconductor Patterns | Ioff (Min) (pA) | Ioff (−7 V) (pA) | Vth (Ini) | dVth | Mobility ($cm^2/Vs$) | dMobility ($cm^2/Vs$) |
|---|---|---|---|---|---|---|
| 1 | 8.35 | 48.32 | 2.516 | −1.747 | 0.638 | 0.010 |
| 2 | 8.25 | 30.27 | 2.840 | −1.719 | 0.641 | 0.004 |
| 3 | 9.80 | 121.57 | 1.902 | −1.605 | 0.777 | −0.010 |
| 4 | 5.60 | 16.01 | 3.407 | −1.684 | 0.543 | −0.025 |
| 5 | 12.23 | 22.74 | 3.667 | −1.696 | 0.565 | 0.001 |
| 6 | 8.81 | 55.65 | 2.312 | −1.812 | 0.637 | −0.013 |

The TFTs were driven for three hours at a temperature of about 60° C.

Referring to Table 2, after the TFT having the semiconductor pattern 1 had been driven for the three hours, the minimum off current Ioff(Min) was about 8.35 pA in the off state. The TFT is turned off in the off state. When the voltage having the level of −7 V was applied to the gate electrode of the TFT having the semiconductor pattern 1, the off current Ioff(−7 V) was about 48.32 pA. The threshold voltage Vth(Ini) at the initial stage was about 2.516 V, and the variation dVth of the threshold voltage after the three hours having passed was about −1.747 V. The electron mobility Mobility at the initial stage was about 0.638 $cm^2/Vs$, and the variation of electron mobility dMobility after the three hours having passed was about 0.010 $cm^2/Vs$.

After the TFT having the semiconductor pattern 2 had been driven for the three hours, the minimum off current Ioff(Min) was about 8.25 pA in the off state. The TFT is turned off in the off state. When the voltage having the level of −7 V was applied to the gate electrode of the TFT having the semiconductor pattern 1, the off current Ioff(−7 V) was about 30.27 pA. The threshold voltage Vth(Ini) at the initial stage was about 2.840 V, and the variation dVth of the threshold voltage after the three hours having passed was about −1.719 V. The electron mobility Mobility at the initial stage was about 0.641 $cm^2/Vs$, and the variation of electron mobility dMobility after the three hours having passed was about 0.004 $cm^2/Vs$.

After the TFT having the semiconductor pattern 3 had been driven for the three hours, the minimum off current Ioff(Min) was about 9.80 pA in the off state. The TFT is turned off in the off state. When the voltage having the level of −7 V was applied to the gate electrode of the TFT having the semiconductor pattern 1, the off current Ioff(−7 V) was about 121.57 pA. The threshold voltage Vth(Ini) at the initial stage was about 1.902 V, and the variation dVth of the threshold voltage after the three hours having passed was about −1.605 V. The electron mobility Mobility at the initial stage was about 0.777 cm$^2$/Vs, and the variation of electron mobility dMobility after the three hours having passed was about −0.010 cm$^2$/Vs.

After the TFT having the semiconductor pattern 4 had been driven for the three hours, the minimum off current Ioff(Min) was about 5.60 pA in the off state. The TFT is turned off in the off state. When the voltage having the level of −7 V was applied to the gate electrode of the TFT having the semiconductor pattern 1, the off current Ioff(−7 V) was about 16.01 pA. The threshold voltage Vth(Ini) at the initial stage was about 3.407 V, and the variation dVth of the threshold voltage after the three hours having passed was about −1.684 V. The electron mobility Mobility at the initial stage was about 0.543 cm$^2$/Vs, and the variation of electron mobility dMobility after the three hours having passed was about −0.025 cm$^2$/Vs.

After the TFT having the semiconductor pattern 5 had been driven for the three hours, the minimum off current Ioff(Min) was about 12.23 pA in the off state. The TFT is turned off in the off state. When the voltage having the level of −7 V was applied to the gate electrode of the TFT having the semiconductor pattern 1, the off current Ioff(−7 V) was about 22.74 pA. The threshold voltage Vth(Ini) at the initial stage was about 3.667 V, and the variation dVth of the threshold voltage after the three hours having passed was about −1.696 V. The electron mobility Mobility at the initial stage was about 0.565 cm$^2$/Vs, and the variation of electron mobility dMobility after the three hours having passed was about 0.001 cm$^2$/Vs.

After the TFT having the semiconductor pattern 6 had been driven for the three hours, the minimum off current Ioff(Min) was about 8.81 pA in the off state. The TFT is turned off in the off state. When the voltage having the level of −7 V was applied to the gate electrode of the TFT having the semiconductor pattern 1, the off current Ioff(−7 V) was about 55.65 pA. The threshold voltage Vth(Ini) at the initial stage was about 2.312 V, and the variation dVth of the threshold voltage after the three hours having passed was about −1.812 V. The electron mobility Mobility at the initial stage was about 0.637 cm$^2$/Vs, and the variation of electron mobility dMobility after the three hours having passed was about 00.013 cm$^2$/Vs.

Each of the semiconductor patterns 1, 2, 4, 5 and 6 having the first semiconductor layer had smaller minimum off current Ioff(Min), smaller off current Ioff(−7 V) at −7 V, smaller electron mobility Mobility and greater threshold voltage Vth than the semiconductor pattern 3 without the first semiconductor layer. Thus, the effect of the off current was decreased, thereby improving electrical characteristics of the TFT.

In the semiconductor patterns 4, 5 and 6, the thickness of the first semiconductor layer was constant, and the thickness of the fourth semiconductor layer was changed. The minimum off current Ioff(Min), the off current Ioff(−7 V) at −7 V and the electron mobility may be decreased, as the thickness of the fourth semiconductor layer may be decreased.

Figure 26:
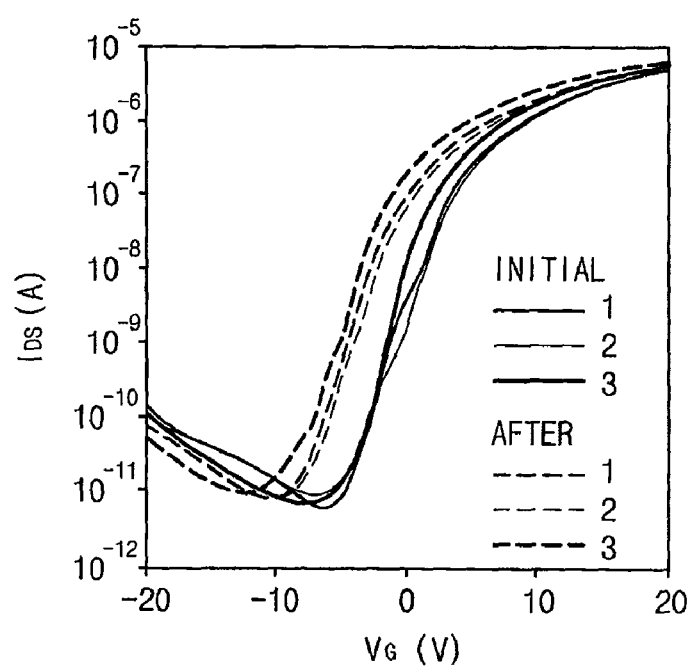
FIGS. 26 and 27 are graphs illustrating a relationship between gate voltage and drain-source current of TFTs according to the present invention.
Figure 27:
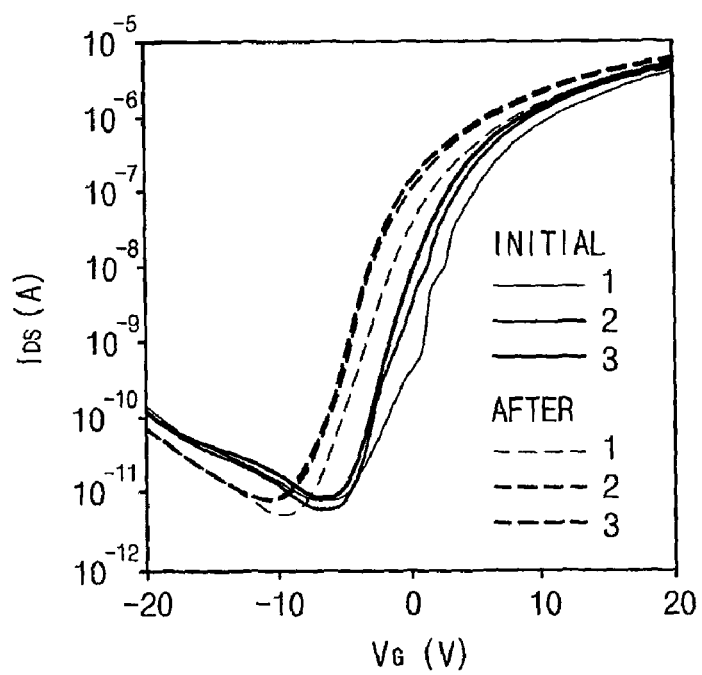

FIGS. 26 and 27 are graphs illustrating a relationship between gate voltage and drain-source current of TFTs according to the present invention.

FIG. 26 is a graph illustrating a relationship between the gate voltage and the drain-source current of the TFTs including the semiconductor patterns 1, 2 and 3 of Table 1. The gate voltage and the drain-source current were tested at the initial stage and after three hours. In FIG. 26, electrical characteristics of the TFTs including the third semiconductor layers having various thicknesses are illustrated.

Referring to FIG. 26 and Table 1, the thicknesses of the first semiconductor layers of the semiconductor patterns 1, 2 and 3 were about 600 Å, 800 Å and 0 Å, respectively. After the TFTs having been driven for about three hours, the electrical characteristics of the semiconductor patterns 1 and 2 were substantially the same, i.e. thickness increase of the first semiconductor decreases the drain-source current slightly, and has minimal improvement.

FIG. 27 is a graph illustrating a relationship between the gate voltage and the drain-source current of the TFTs including the semiconductor patterns 4, 1 and 6 of Table 1. The gate voltage and the drain-source current were tested at the initial stage and after three hours. In FIG. 27, electrical characteristics of the TFTs including the fourth semiconductor layers having various thicknesses are illustrated.

Referring to FIG. 27 and Table 1, the thicknesses of the third semiconductor layers of the semiconductor patterns 4, 1 and 6 were about 100 Å, 300 Å and 400 Å, respectively. After the TFTs having been driven for about three hours, the drain-source current of the semiconductor patterns 4, 1 and 6 were rapidly decreased, as the thickness of the fourth semiconductor layer was decreased.

Figure 28:
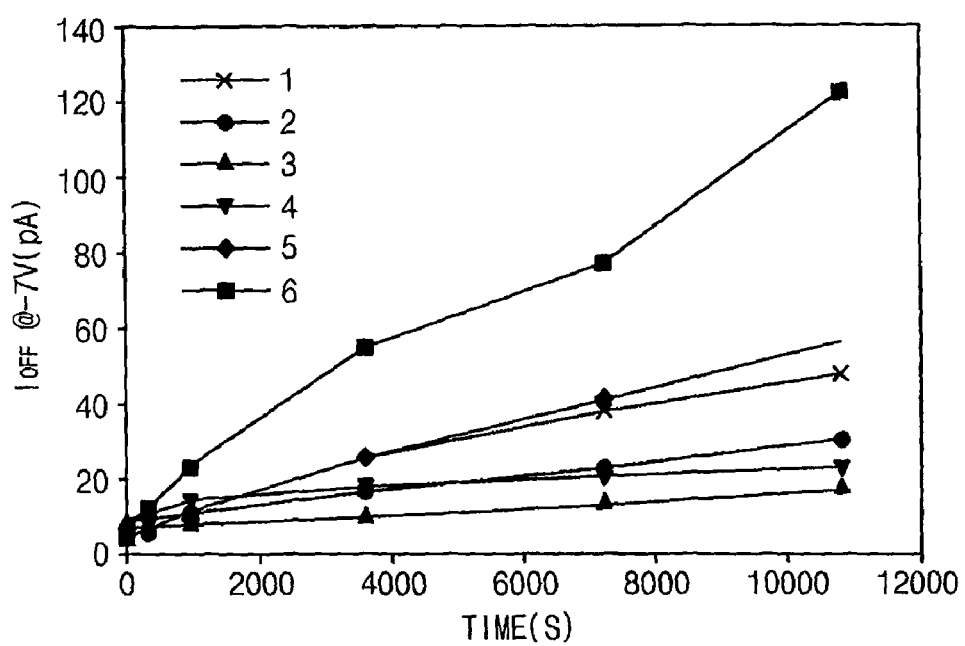
FIG. 28 is a graph illustrating a relationship between time and off current of TFTs according to the present invention.

FIG. 28 is a graph illustrating a relationship between time and off current of TFTs according to the present invention. In FIG. 28, −7 V was applied to the gate electrode of each of the TFTs.

Referring to FIG. 28, the TFT including the semiconductor pattern 6 of Table 1 had the poorest electrical stability, and the TFT including the semiconductor pattern 4 of Table 1 had the best electrical stability. The TFT including the semiconductor pattern 3 of Table 1 had the lowest absolute value of the drain-source current at the initial stage. However, the drain-source current flowing the semiconductor pattern 3 had been increased with respect to the initial value.

EXAMPLE 2

Figure 29:
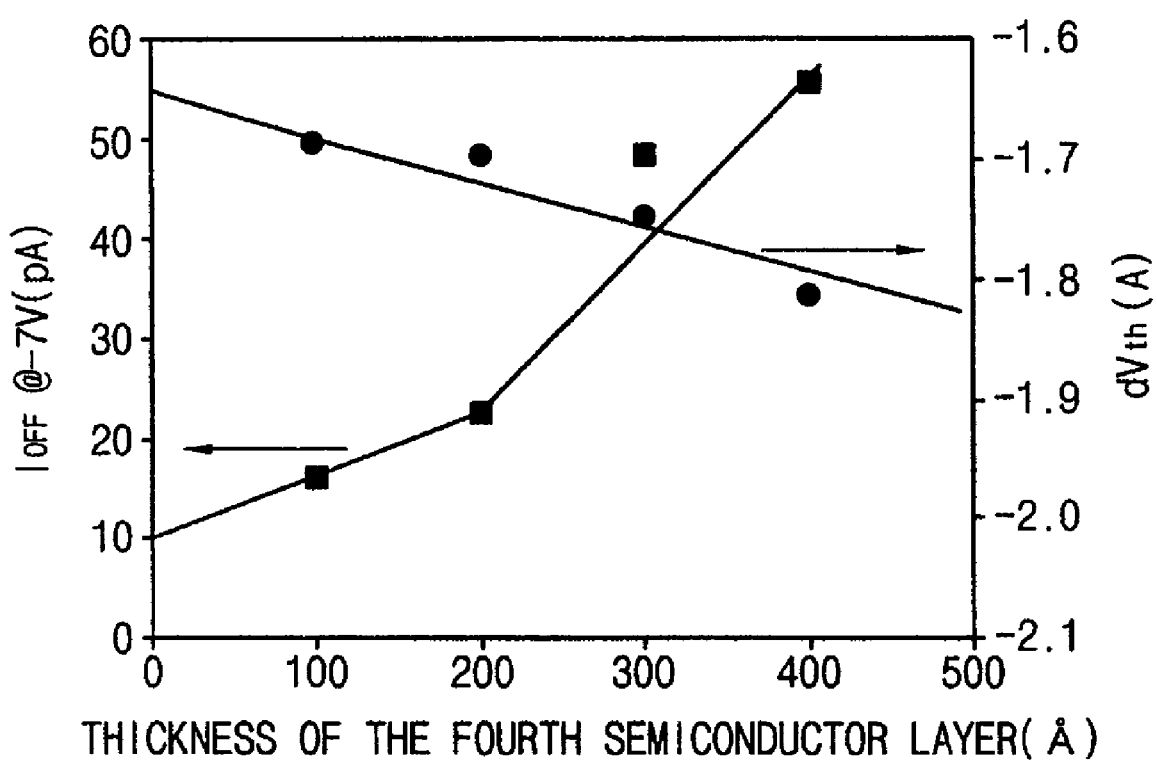
FIG. 29 is a graph illustrating a relationship between thickness of a fourth semiconductor layer and electrical characteristics of a TFT according to the present invention.

FIG. 29 is a graph illustrating a relationship between thickness of fourth semiconductor layers and electrical characteristics of TFTs according to the present invention. The TFTs of FIG. 29 are the same as in FIGS. 1A to 4B except for the thickness of a fourth semiconductor layer. Thus, any further explanation concerning the above elements will be omitted.

In FIG. 29, the thicknesses of the fourth semiconductor layers were 0 Å, 100 Å, 200 Å, 300 Å and 400 Å. The left axis of the graph represents the off current when −7 V is applied to gate electrodes of the TFTs. The right axis of the graph represents the variation dVth of the threshold voltage of the TFTs.

Referring to FIG. 29, the off current(■) was decreased and the variation dVth of the threshold voltage(●) was increased, as the thickness of the fourth semiconductor layer was decreased. When the off current was decreased and the variation dVth of the threshold voltage was increased, malfunctions of the TFT were decreased. Thus, the electrical characteristics of the TFT were improved.

According to some example embodiments of the present invention, electrical characteristics at a boundary between a semiconductor pattern and a protective layer may be improved to decrease an off current.

In addition, the off current may be decreased although the manufacturing time is not increased. Thus, manufacturing costs may be decreased, and productivity may be improved.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A thin-film transistor (TFT) comprising:
   a gate electrode;
   a semiconductor pattern on the gate electrode, the semiconductor pattern including:
     a first semiconductor layer having a first density; and
     a second semiconductor layer disposed under the first semiconductor layer, the second semiconductor layer having a second density lower than the first density;
   first and second electrodes spaced apart from each other on the semiconductor pattern; and
   a protective layer formed on the semiconductor pattern to cover the first and second electrodes, the protective layer making contact with a channel region of the first semiconductor layer.

2. The TFT of claim 1, wherein the protective layer comprises two layers having different densities, and one of the two layers, which has a higher density, makes contact with the channel region of the first semiconductor layer to form an interface with the first semiconductor layer.

3. The TFT of claim 1, further comprising a gate insulation layer interposed between the gate electrode and the semiconductor pattern, wherein a portion of the gate insulation layer makes contact with the first semiconductor layer to form an interface with the gate insulation layer.

4. A TFT comprising:
   a gate electrode;
   a gate insulation layer on the gate electrode, the gate insulation layer making contact with the gate electrode to form an interface with the gate electrode;
   a semiconductor pattern on the gate insulation layer to form an interface with the gate insulation layer, the semiconductor pattern including:
     a first semiconductor layer having a first density; and
     a second semiconductor layer having a second density lower than the first density;
   a first electrode on the semiconductor pattern;
   a second electrode spaced apart from the first electrode on the semiconductor pattern; and
   a protective layer formed on the semiconductor pattern to cover the first and second electrodes, the protective layer making contact with a channel region of the first semiconductor layer to form an interface with the first semiconductor layer,
   wherein the second semiconductor layer is formed on the gate insulation layer and the first semiconductor layer is formed on the second semiconductor layer, the first semiconductor layer forming an interface with the second semiconductor layer and an interface with the protective layer.

5. The TFT of claim 4, wherein the protective layer comprises:
   a first protective film making an interface with the channel region of the first semiconductor layer; and
   a second protective film having a lower density than the first protective film.

6. The TFT of claim 4, further comprising an ohmic contact layer interposed between the semiconductor pattern and the first and second electrodes,
   wherein the first semiconductor layer makes contact with the ohmic contact layer to form an interface with the ohmic contact layer.

7. The TFT of claim 4, wherein the semiconductor pattern comprises hydrogenated amorphous silicon.

8. The TFT of claim 4, further comprising a third semiconductor layer deposited between the gate insulation layer and the second semiconductor layer having a third density that is higher than the second density to form an interface with the gate insulation layer and an interface with the second semiconductor layer.

9. The TFT of claim 8, wherein an upper portion of the third semiconductor layer adjacent to the second semiconductor layer is treated with hydrogen plasma.

10. The TFT of claim 8, wherein the third density is substantially the same as the first density.

11. The TFT of claim 10, wherein the first semiconductor layer is deposited at a first deposition speed, and the first deposition speed is about 6 to about 12 Å/s.

12. The TFT of claim 8, further comprising a fourth semiconductor layer, having a fourth density lower than the first density, deposited on the first semiconductor.

13. The TFT of claim 12, further comprising an ohmic contact layer interposed between the semiconductor pattern and the first and second electrodes,
   wherein the fourth semiconductor layer makes contact with the ohmic contact layer to form an interface with the ohmic contact layer.

14. A method of manufacturing a TFT, comprising:
   forming a gate insulation layer on an insulating substrate, the gate insulation layer covering a gate electrode;
   forming a semiconductor pattern including first and second semiconductor layers that are deposited at different deposition speeds in a vertical direction of the gate insulation layer; and
   forming a protective layer on the gate insulation layer to cover the semiconductor pattern, the protective layer making contact with one of the first and second semiconductor layers that is deposited at a slower speed than the other,
   wherein forming the semiconductor pattern further comprises:
   depositing the second semiconductor layer on the gate insulation layer at a second deposition speed; and
   depositing the first semiconductor layer on the second semiconductor layer at a first deposition speed that is slower than the second deposition speed.

15. The method of claim 14, further comprising forming an ohmic contact layer on the first semiconductor layer, the ohmic contact layer forming an interface with the first semiconductor layer.

16. The method of claim 14, wherein the semiconductor pattern comprises hydrogenated amorphous silicon.

17. The method of claim 14, further comprising:
- forming a conductive layer on the gate insulation layer on which the semiconductor pattern is formed; and
- patterning the conductive layer and the semiconductor pattern using a single mask.

18. The method of claim 14, wherein forming the semiconductor pattern comprises:
- depositing a first layer on the gate insulation layer at a first deposition speed;
- depositing a second layer on the first layer at a second deposition speed that is different from the first deposition speed;
- patterning the first and second layers using a first mask to form the first and second semiconductor layers;
- forming a conductive layer on the gate insulation layer to cover the first and second semiconductor layers; and
- patterning the conductive layer using a second mask to form a data pattern.

19. The method of claim 14, further comprising depositing a third semiconductor layer on the gate insulation layer at a third deposition speed that is slower than the second deposition speed prior to depositing the second semiconductor layer.

20. The method of claim 19, further comprising treating the third semiconductor layer with hydrogen plasma prior to depositing the second semiconductor layer.

21. The method of claim 19, wherein the third deposition speed is substantially the same as the first deposition speed.

22. The method of claim 21, wherein the first deposition speed is about 6 to about 12 Å/s.

23. The method of claim 19, further comprising depositing a fourth semiconductor layer on the first semiconductor layer at a fourth deposition speed faster than the first deposition speed.

24. The method of claim 23, further comprising forming an ohmic contact layer on the fourth semiconductor layer, the ohmic contact layer forming an interface with the fourth semiconductor layer.

* * * * *